United States Patent
Marui

(10) Patent No.: US 7,906,987 B2
(45) Date of Patent: Mar. 15, 2011

(54) SEMICONDUCTOR INTEGRATED CIRCUIT, PROGRAM TRANSFORMATION APPARATUS, AND MAPPING APPARATUS

(75) Inventor: Shinichi Marui, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/375,063

(22) PCT Filed: Jul. 19, 2007

(86) PCT No.: PCT/JP2007/064261
§ 371 (c)(1),
(2), (4) Date: Jan. 26, 2009

(87) PCT Pub. No.: WO2008/013098
PCT Pub. Date: Jan. 31, 2008

(65) Prior Publication Data
US 2009/0237113 A1    Sep. 24, 2009

(30) Foreign Application Priority Data

Jul. 27, 2006 (JP) .................................. 2006-204383

(51) Int. Cl.
*H03K 19/173* (2006.01)
(52) U.S. Cl. .................. 326/38; 326/40; 326/41; 326/47
(58) Field of Classification Search .............. 326/37–41, 326/47
See application file for complete search history.

(56) References Cited

U.S. PATENT DOCUMENTS

| | | | |
|---|---|---|---|
| 5,594,363 A | | 1/1997 | Freeman et al. |
| 5,671,432 A | * | 9/1997 | Bertolet et al. .................. 712/11 |
| 5,682,107 A | * | 10/1997 | Tavana et al. .................... 326/41 |
| 5,692,147 A | * | 11/1997 | Larsen et al. .................. 711/202 |
| 5,732,246 A | * | 3/1998 | Gould et al. .................... 716/16 |
| 5,867,507 A | * | 2/1999 | Beebe et al. .................. 714/726 |
| 6,021,513 A | * | 2/2000 | Beebe et al. .................. 714/726 |
| 6,096,091 A | | 8/2000 | Hartmahn |
| 6,167,559 A | * | 12/2000 | Furtek et al. .................... 716/16 |
| 6,335,635 B1 | | 1/2002 | Patel et al. |
| 6,970,013 B1 | * | 11/2005 | Cory ................................ 326/38 |
| 7,268,581 B1 | * | 9/2007 | Trimberger et al. ............ 326/38 |
| 7,616,025 B1 | * | 11/2009 | Irving et al. .................... 326/38 |
| 2001/0052793 A1 | * | 12/2001 | Nakaya .......................... 326/41 |
| 2003/0004547 A1 | * | 1/2003 | Owen et al. ...................... 607/5 |
| 2003/0201795 A1 | * | 10/2003 | Lien et al. ........................ 326/41 |
| 2004/0017221 A1 | * | 1/2004 | Agarwal ......................... 326/38 |

(Continued)

FOREIGN PATENT DOCUMENTS

EP           0748053           12/1996

(Continued)

OTHER PUBLICATIONS

English language Abstract of JP 9-8646, Jan. 10, 1997.
English language Abstract of JP 2003-329743, Nov. 19, 2003.

*Primary Examiner* — Jason M Crawford
(74) *Attorney, Agent, or Firm* — Greenblum & Bernstein, P.L.C.

(57) ABSTRACT

A semiconductor integrated circuit (100) according to the present invention includes a plurality of reconfigurable cores (101) arranged separately from each other in a matrix, and a first group of register circuits (102) formed between a first and second reconfigurable cores included in the reconfigurable cores (101). Each of the reconfigurable cores (101) operates synchronously with clock signals and has a logic reconfiguration function, and includes a plurality of logic elements (201) that implements predetermined logic and programmable wiring (202 and 203) that interconnects the plurality of logic elements (201). The first group of register circuits (102) temporarily holds output from the first reconfigurable core and transfers the output to the second reconfigurable core.

17 Claims, 18 Drawing Sheets

U.S. PATENT DOCUMENTS

| | | |
|---|---|---|
| 2007/0214336 A1 | 9/2007 | Shimura |
| 2008/0005632 A1 | 1/2008 | Inoue |
| 2008/0079468 A1 | 4/2008 | Suginaka |
| 2008/0186059 A1 | 8/2008 | Nozoe |
| 2009/0015293 A1 | 1/2009 | Ito et al. |

FOREIGN PATENT DOCUMENTS

| | | |
|---|---|---|
| EP | 1697867 | 9/2006 |
| JP | 9-8646 | 1/1997 |
| JP | 2003-329743 | 11/2003 |
| WO | 2005/062212 | 7/2005 |

\* cited by examiner

SEMICONDUCTOR INTEGRATED CIRCUIT, PROGRAM TRANSFORMATION APPARATUS, AND MAPPING APPARATUS

TECHNICAL FIELD

The present invention relates to a semiconductor integrated circuit, a program transformation apparatus, and a mapping apparatus, and in particular, to a semiconductor integrated circuit having a plurality of reconfigurable cores.

BACKGROUND ART

Conventionally, there have been semiconductor integrated circuits that have a logic reconfiguration function (hereinafter referred to as "reconfigurable logic semiconductor integrated circuits") as typified by a field programmable gate array (FPGA).

FIG. 1 shows an overall configuration of a conventional reconfigurable logic semiconductor integrated circuit. A conventional reconfigurable logic semiconductor integrated circuit 500 shown in FIG. 1 includes a plurality of logic elements (LE) 501 arranged in a matrix. In an FPGA, which is a reconfigurable logic semiconductor integrated circuit, the logic elements 501 are composed of a look-up table (LUT). Rewriting the LUT changes relation of output to input of the logic elements 501. The logic elements 501 are interconnected by programmable wiring that is not shown. The programmable wiring programmably determines output from which logic element 501 is inputted to which logic element 501. Changing of relation of output to input of the logic elements 501 and changing of connections between the logic elements 501 provides the semiconductor integrated circuit 500 with a desired circuit function.

For the programmable wiring, connection flexibility is increased most when all the logic elements are respectively and directly interconnected. However, this requires enormous wiring resource, and thus is impractical. On the other hand, interconnecting the logic elements only on a one-to-one basis provides no flexibility. Various interconnection structures that balance wiring resource and flexibility for efficiency have been conceived. For example, a known technique using one of such structures is disclosed in Patent Reference 1.

Hereinafter, a method for mapping a desired circuit function in the reconfigurable logic semiconductor integrated circuit 500 shown in FIG. 1 is described with reference to FIG. 2. FIG. 2 shows a procedure of mapping in a conventional reconfigurable logic semiconductor integrated circuit 500. The mapping shown in FIG. 2 is executed using a synthesis tool and a place and route (P & R) tool. These tools are specialized for each of architectures of the reconfigurable logic semiconductor integrated circuits 500.

First, a user describes a circuit function to be achieved in a hardware description language such as HDL or a high-level language such as the C language (S101). Next, the synthesis tool synthesizes logic on the described circuit function (S102). Specifically, the synthesis tool divides the described circuit function into functional units each of which can be assigned to each of the logic element 501. The synthesis tool then determines connections between the divided functional units.

Subsequently, the P & R tool places the divided functional units on the logic element 501 in an actual circuit (S103). A function (relation of output to input) of each logic element 501 is thus determined.

Following this, the P & R tool routes the logic elements 501 using the programmable wiring so that the connections determined by the logic synthesis are achieved (S104).

The placing and routing above are repeated until predetermined constraints on speed (timing) and a circuit region (area) are fulfilled. The mapping ends when the constraints are fulfilled. The logic synthesis may be performed again when the predetermined constraints are not fulfilled.

Patent Reference 2 discloses a method for constructing a large-scale reconfigurable logic semiconductor integrated circuit through less design processes by interconnecting two FPGAs on a mask layout.

Patent Reference 1: Specification of U.S. Pat. No. 5,594,363
Patent Reference 2: Specification of U.S. Pat. No. 6,335,635

DISCLOSURE OF INVENTION

Problems that Invention is to Solve

In recent years, however, digital equipment such as digital TVs and mobile phones are becoming notably multifunctional, and processes in such digital equipment are becoming more complicated. In keeping with this trend, the scale of circuit functions to be achieved using reconfigurable logic semiconductor integrated circuits is increasing, and so is a need for mapping the large-scale circuit functions on reconfigurable logic semiconductor integrated circuits.

The reconfigurable logic semiconductor integrated circuit disclosed in Patent Reference 2 is excellent in scalability and relatively easy to be increased in scale because it is an aggregation of basic units. However, mapping a large-scale circuit function on a large-scale reconfigurable logic semiconductor integrated circuit increases combinations of functional units into which the circuit function to be achieved is divided into. Furthermore, it increases combinations of the functional units and logic elements to which the functional units are assigned respectively. Furthermore, it increases combinations of the logic elements to be interconnected using programmable wiring. This will lead to steep increase in combinations for mapping as the scale of the circuit become larger. Accordingly, mapping may not converge when an attempt is made to achieve the circuit function in a reconfigurable logic semiconductor integrated circuit as large in scale as possible using a conventional synthesis tool and a P & R tool. However, there is not a synthesis tool or a P & R tool useful enough to solve these problems.

The present invention, conceived to address the problems, has an object of providing a reconfigurable logic semiconductor integrated circuit on which a large-scale circuit function is easily mapped.

The present invention has another object of providing a layout of semiconductor integrated circuit that can be easily designed in a small area when a plurality of reconfigurable cores is installed on a single chip in order to construct a large-scale reconfigurable logic semiconductor integrated circuit.

Means to Solve the Problems

In order to achieve the above-mentioned object, the semiconductor integrated circuit according to the present invention includes: a plurality of reconfigurable cores arranged separately from one another, the plurality of reconfigurable cores each operating synchronously with a clock signal and having a logic reconfiguration function; and a first group of register circuits formed between a first reconfigurable core and a second reconfigurable core included in the plurality of reconfigurable cores, the first group of register circuits configured to temporarily hold output from the first reconfigurable core and transfer the output to the second reconfigurable core, wherein the plurality of reconfigurable cores each includes: a plurality of logic elements arranged in a matrix and each configured to implement predetermined logic; and programmable wiring interconnecting the plurality of logic elements.

This structure allows mapping of a circuit function on reconfigurable cores that are separate from one another; thus, the mapping will converge in a short period of time even for a large-scale circuit function on a reconfigurable logic semiconductor integrated circuit. As a result, the present invention will provide a reconfigurable logic semiconductor integrated circuit on which a large-scale circuit function is easily mapped.

Furthermore, the first group of register circuits may include: a first register circuit configured to temporarily hold output from the first reconfigurable core; and a second register circuit configured to hold data outputted from the first register circuit and output the data to the second reconfigurable core.

This structure will ease a timing constraint because of delay due to the line length.

Furthermore, the first register circuit and the second register circuit may receive the same clock signal as a clock signal provided for the reconfigurable core that receives the data held in the second register circuit.

This structure allows the second register circuit to hold the data securely even when the reconfigurable cores are operated asynchronously. As a result, metastability (a state where setup constraint or hold constraint is not satisfied) will be avoided.

Furthermore, the reconfigurable core that outputs data to the first group of register circuits and the reconfigurable core that receives the data from the first group of register circuits may receive different clock signals.

This structure prevents metastability from occurring when the reconfigurable cores are operated asynchronously.

Furthermore, the plurality of reconfigurable cores may include a third reconfigurable core and a fourth reconfigurable core each having a rectangular shape defined by a first side, a second side opposite to the first side, a third side perpendicular to the first side, and a fourth side opposite to the third side, the first side configured to receive configuration data for reconfiguring logic of the reconfigurable core, and the third and fourth reconfigurable cores arranged separately from each other with the first sides of the third and fourth reconfigurable cores facing each other.

This structure provides the configuration data for the third and the fourth reconfigurable cores from the first sides thereof, so that storage circuits to store the configuration data can be disposed collectively and chips can be designed more easily. In addition, this configuration shortens lengths of lines from the storage circuits to the third and the fourth reconfigurable cores. As a result, functions of the reconfigurable cores will be dynamically reconfigured in a short period of time. Accordingly, the present invention will provide a semiconductor integrated circuit having a layout for easier designing in a smaller area when a plurality of reconfigurable cores is installed on a single chip in order to construct a large-scale reconfigurable logic semiconductor integrated circuit.

Furthermore, the semiconductor integrated circuit may further include a first storage circuit formed between the third and fourth reconfigurable cores, the first storage circuit configured to store configuration data for reconfiguring logic of the third and fourth reconfigurable cores.

This structure will provides the configuration data stored in the first storage circuit for the third and the fourth reconfigurable cores from the first sides thereof, so that storage circuits to store the configuration data can be disposed collectively and chips can be designed more easily. Additionally, this configuration shortens lengths of lines from the storage circuits to the third and the fourth reconfigurable cores. As a result, functions of the reconfigurable cores will be dynamically reconfigured in a short period of time.

Furthermore, the plurality of reconfigurable cores may further include a fifth reconfigurable core and a sixth reconfigurable core each having a rectangular shape defined by the first side, the second side opposite to the first side, the third side perpendicular to the first side, and the fourth side opposite to the third side, the fifth and sixth reconfigurable cores arranged separately from each other with the first sides of the fifth and sixth reconfigurable cores facing each other, the third and fifth reconfigurable cores arranged separately from each other with the third sides of the third and fifth reconfigurable cores facing each other, and the fourth and sixth reconfigurable cores arranged separately from each other with the third sides of the fourth and sixth reconfigurable cores facing each other.

This structure allows each of the reconfigurable cores to have signal input and output terminals for signals for the same purposes facing each other between the reconfigurable cores when the four reconfigurable cores are installed on a single chip in order to construct a large-scale reconfigurable logic semiconductor integrated circuit. This makes chip designing easier and shortens lengths of lines between the reconfigurable cores.

Furthermore, the semiconductor integrated circuit may further include a second storage circuit formed between the fifth and sixth reconfigurable cores, the second storage circuit configured to store configuration data for reconfiguring logic of the fifth and sixth reconfigurable cores.

This structure provides the configuration data stored in the second storage circuit for the fifth and the sixth reconfigurable cores from the first sides thereof, so that storage circuits to store the configuration data can be disposed collectively and chips can be designed more easily. In addition, this configuration shortens lengths of lines from the second storage circuit to the fifth and the sixth reconfigurable cores. As a result, functions of the reconfigurable cores will be dynamically reconfigured in a short period of time.

Furthermore, the semiconductor integrated circuit may further include a clock signal stopping circuit that stops providing a clock signal for the first group of register circuits.

This structure allows mapping of a circuit function on the reconfigurable cores, handling them as circuits separate from one another, even when data is bi-directionally transmitted between the reconfigurable cores. Accordingly, the mapping will converge in a short period of time even for a large-scale circuit function on a reconfigurable logic semiconductor integrated circuit.

Furthermore, the first group of register circuits may include: a second group of register circuits configured to temporarily hold output from the first reconfigurable core and to transfer the output to the second reconfigurable core; and a third group of register circuits configured to temporarily hold output from the second reconfigurable core and to transfer the output to the first reconfigurable core.

This structure allows mapping of a circuit function on the reconfigurable cores, handling all the reconfigurable cores as circuits separate from one another Furthermore, the first group of register circuits may be disposed in each gap between side-by-side reconfigurable cores included in the plurality of reconfigurable cores, and be configured to temporarily hold output from one member of a pair of the side-by-side reconfigurable cores and to transfer the output to the other member of the pair of the side-by-side reconfigurable cores.

This structure allows stopping providing clock signals for the unused first group of register circuits and reduces excess power consumption for the semiconductor integrated circuit according to the present invention.

Furthermore, all of the plurality of reconfigurable cores may receive the same clock signal.

This structure simplifies a structure of the semiconductor integrated circuit.

Furthermore, the first group of register circuits may hold a plurality of sets of multi-bit data.

This structure allows the semiconductor integrated circuit according to the present invention to transmit and receive a plurality of items of data between the reconfigurable cores.

Furthermore, each of the logic elements may have an LUT.

This structure allows changing relation of output to input of the logic elements by rewriting the LUT.

Furthermore, each of the logic elements may have at least one arithmetic logic unit (ALU).

This structure provides a reconfigurable core that is suitable for signal processing operation that is usually composed of repetitive simple calculations of image encoding and decoding or cryptographic processing.

Furthermore, the semiconductor integrated circuit may further include a central processing unit (CPU), wherein the plurality of reconfigurable cores, the first group of register circuits, and the CPU are installed on a single semiconductor substrate.

This structure allows a system on chip (SOC) including the reconfigurable logic semiconductor integrated circuit with the CPU to execute a variety of processes without special hardware.

A mapping apparatus according to the present invention that maps, on a semiconductor integrated circuit, a circuit function described in a circuit description, the semiconductor integrated circuit having: a plurality of reconfigurable cores arranged separately from one another and having a logic reconfiguration function; and a first group of register circuits formed between at least two reconfigurable cores included in the plurality of reconfigurable cores and temporarily holding output from one of the reconfigurable cores and transferring the output to another one of the reconfigurable cores, the mapping apparatus includes: a dividing unit configured to divide the circuit function into a plurality of circuit function blocks; an eliminating unit configured to eliminate a register from between the plurality of circuit function blocks; a synthesis unit configured to execute logic synthesis on each of the plurality of circuit function blocks between which the register has been eliminated from; and a placing and routing unit configured to place and route, on each of the reconfigurable cores, each of the plurality of circuit function blocks on which the logic synthesis has been executed.

This structure allows the mapping apparatus according to the present invention to exclude a register that corresponds to the first group of registers included in the circuit description from being mapped. In addition, the mapping apparatus according to the present invention executes mapping, handling each of the reconfigurable cores as a separate circuit. Accordingly, the mapping apparatus according to the invention will have the mapping converge in a short period of time even for a large-scale circuit function on a reconfigurable logic semiconductor integrated circuit.

A program transformation apparatus that transforms a circuit description in which a circuit function of a circuit composed of a plurality of modules is described, the program transformation apparatus includes: a calculation unit configured to calculate, according to the circuit description, a constraint of an input signal and an output signal of the circuit; a generating unit configured to generate a plurality of patterns in which a register is or is not inserted between the plurality of modules; an extracting unit configured to extract, out of the generated plurality of patterns, at least one pattern that fulfills the constraint; and a selecting unit configured to select one of the at least one extracted patterns and output the selected pattern as a transformed circuit description.

This structure allows the program transformation apparatus according to the present invention to insert registers corresponding to the first group of register circuits into a circuit description. In other words, the program transformation apparatus according to the present invention converts a circuit description described in a conventional manner by a designer into a circuit description with two registers in series inserted between modules.

Furthermore, the program transformation may further include a feedback extracting unit configured to extract, out of the plurality of modules, a plurality of modules that forms a feedback system, wherein the generating unit, handling the plurality of modules extracted by the feedback extracting unit as a single module, is configured to generate a plurality of patterns in which a register is or is not inserted between the modules.

This structure allows the program transformation apparatus according to the present invention avoid inserting a register between modules that form a feedback system. This reduces workload of the program transformation apparatus.

A mapping method executed in a mapping apparatus for mapping, on a semiconductor integrated circuit, a circuit function described in a circuit description, the semiconductor integrated circuit having: a plurality of reconfigurable cores arranged separately from one another and having a logic reconfiguration function; and a first group of register circuits formed between at least two reconfigurable cores included in the plurality of reconfigurable cores and temporarily holding output from one of the reconfigurable cores and transferring the output to another one of the reconfigurable cores, the mapping method includes: dividing the circuit function into a plurality of circuit function blocks; eliminating a register from between the circuit function blocks; executing logic synthesis on each of the plurality of circuit function blocks between which the register has been eliminated from; and placing and routing, on each of the reconfigurable cores, each of the plurality of circuit function blocks on which the logic synthesis has been executed.

This method will exclude a register that corresponds to the first group of registers included in the circuit description from being mapped. In addition, the mapping apparatus according to the present invention executes mapping, handling each of the reconfigurable cores as a separate circuit. Accordingly, the mapping will converge in a short period of time even for a large-scale circuit function on a reconfigurable logic semiconductor integrated circuit.

A program transformation method according to the present invention is to be executed in a program transformation apparatus that transforms a circuit description in which a circuit function of a circuit composed of a plurality of modules is described, the program transformation method including: calculating, according to the circuit description, a constraint of an input signal and an output signal of the circuit; generating a plurality of patterns in which a register is or is not inserted between the plurality of modules; extracting, out of the generated plurality of patterns, at least one pattern that fulfills the constraint; and selecting one of the at least one extracted patterns and outputting the selected pattern as a transformed circuit description.

This method inserts registers corresponding to the first group of register circuits into a circuit description. In other words, the program transformation method according to the present invention converts a circuit description described in a conventional manner by a designer into a circuit description with two registers in series inserted between modules.

It is noted that the present invention may be implemented not only as such a semiconductor integrated circuit, a mapping apparatus, a mapping method thereof, a program transformation apparatus, or a program transformation method thereof, but also as a program that causes a computer to execute characteristic steps included in the mapping method or the program transformation method. It is also noted that such a program may be, not to mention, distributed via storage media such as a CD-ROM or a transmission media such as the Internet.

Effects of the Invention

The present invention provides a reconfigurable logic semiconductor integrated circuit on which a large-scale circuit function is easily mapped. The present invention also provides a layout of semiconductor integrated circuit that can be easily designed in a small area when a plurality of reconfigurable cores is installed on a single chip in order to construct a large-scale reconfigurable logic semiconductor integrated circuit.

NUMERICAL REFERENCES

Figure 1:
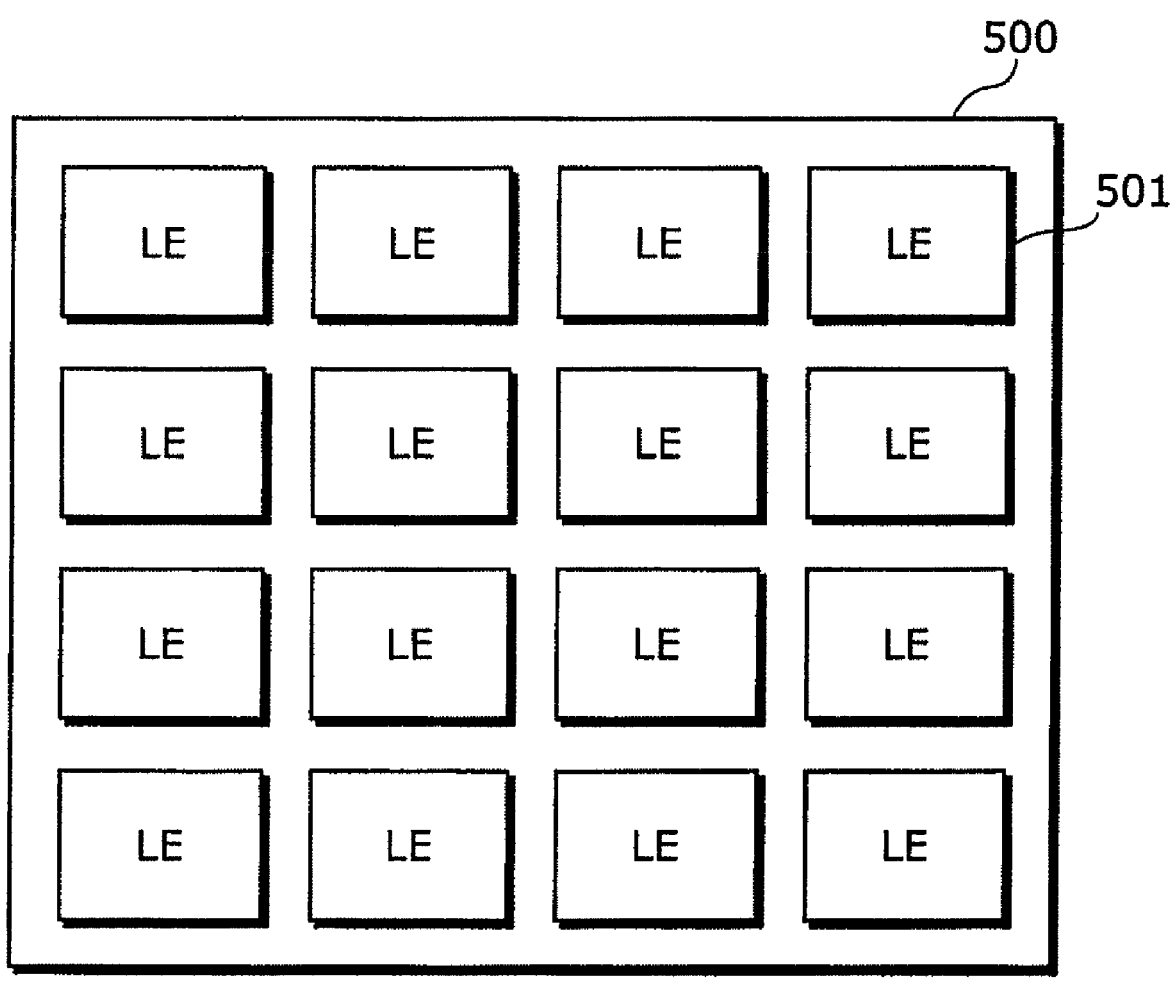
FIG. 1 shows a configuration of a conventional reconfigurable logic semiconductor integrated circuit.
Figure 2:
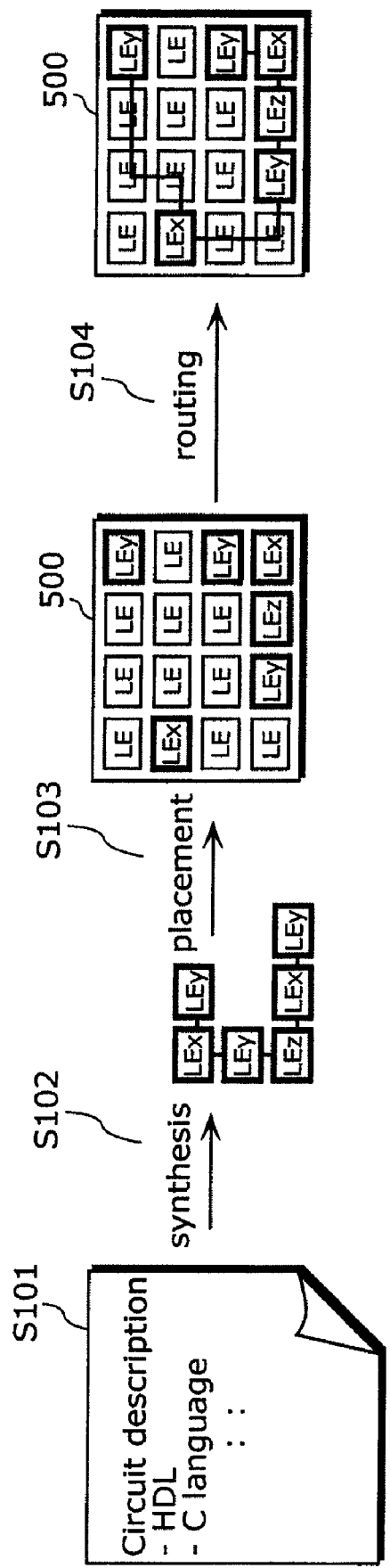
FIG. 2 shows a procedure of mapping in a conventional reconfigurable logic semiconductor integrated circuit.

1 Semiconductor apparatus
10 CPU
11 RAM
12 DMA
13 Hardware circuit
100, 150, 200, 500 Semiconductor integrated circuits (FPGA)
101, 101A, 101B, 101C, 101D Reconfigurable cores
102 Register circuit
103, 103A, 103B, 103C, 103D Memories
104 First clock signal stopping circuit
105 Second clock signal stopping circuit
201, 501 Logic elements
202 Switch box
203 Group of the circuit boxes
204E, 204N, 204S, 204W IO units
210 Look-up table
211 Multiplexer
212 Flip-flop
221A, 221B, 221C, 221D, 221E, 221F, 301A, 301B, 301C, 301D, 301E Modules
222A, 222B, 222C, 222D, 222E, 302, 302AB, 302AD, 302AF, 302BD, 302BF Registers
301F Virtual module
400 Mapping apparatus
401 Keyboard
402 Display
403 CPU
404 ROM
405 RAM
406 Program

BEST MODE FOR CARRYING OUT THE INVENTION

Hereinafter, a semiconductor integrated circuit according to the present invention is described in detail with reference to figures.

First Embodiment

A semiconductor integrated circuit according to the first embodiment of the present invention has two register circuits in series in each of gaps between a plurality of reconfigurable cores. Such a semiconductor integrated circuit allows mapping of a circuit function on the reconfigurable cores, handling them as circuits separate from one another. It is thus possible to easily map a large-scale circuit function even on a reconfigurable logic semiconductor integrated circuit.

The semiconductor integrated circuit according to the first embodiment of the present invention is described below.

Figure 3:
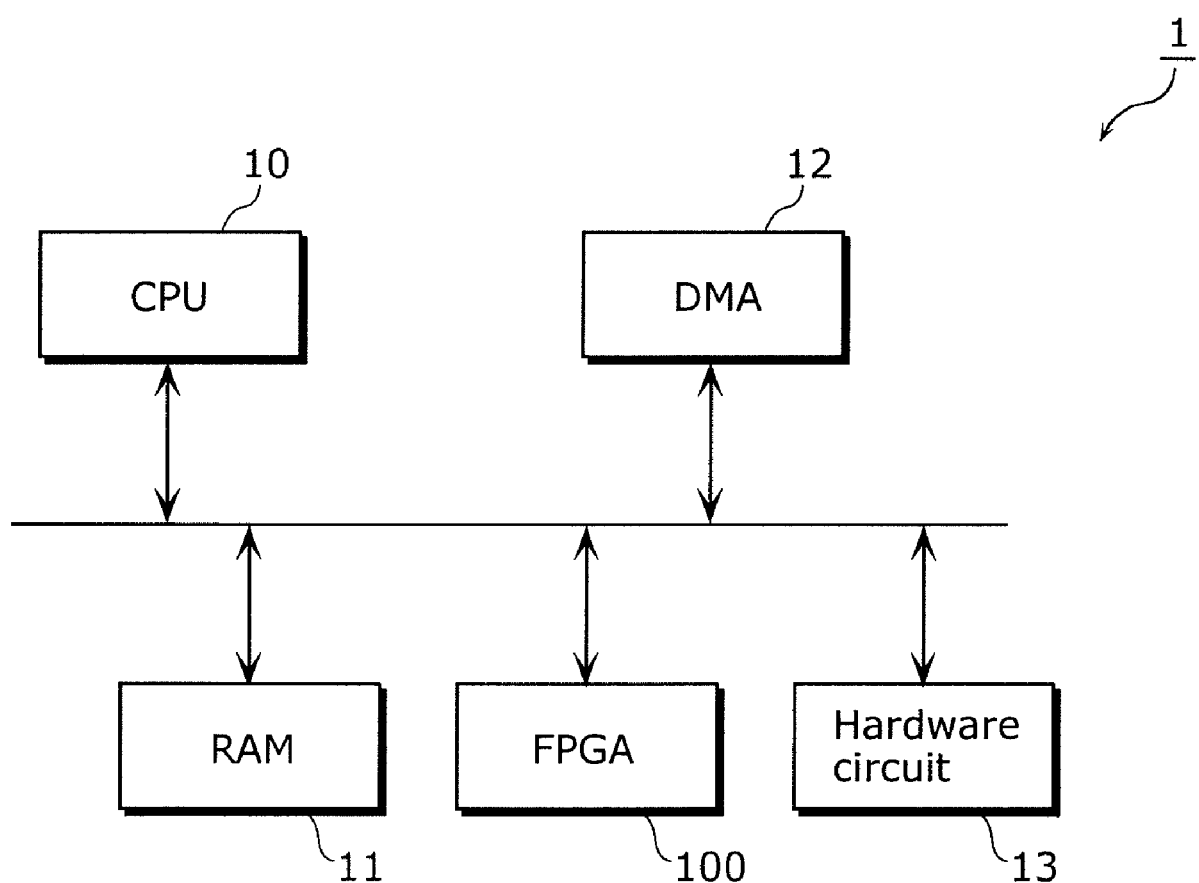
FIG. 3 shows a configuration of a semiconductor integrated circuit according to the first embodiment of the present invention.

FIG. 3 shows a configuration of a semiconductor device that has a reconfigurable logic semiconductor integrated circuit according to the first embodiment of the present invention.

The semiconductor device 1 shown in FIG. 3 has a CPU 10, random access memory (RAM) 11, a direct memory access (DMA) 12, a hardware circuit 13, and an FPGA 100.

The CPU 10 performs an entire control of the semiconductor device 1. The RAM 11 is a readable and writable storage unit. The DMA 12 transfers data between the FPGA 100 and the RAM 11 and between the hardware circuit 13 and the RAM 11. The hardware circuit 13 is a circuit composed of special hardware to achieve a predetermined function. The FPGA 100 is a reconfigurable logic semiconductor integrated circuit that exemplifies the semiconductor circuit according the present invention.

For example, the CPU 10, the RAM 11, the DMA 12, the hardware circuit 13, and the FPGA 100 are installed on a single semiconductor substrate. In other words, the semiconductor integrated circuit (FPGA) 100 according to the first embodiment of the present invention is configured as a circuit block in a what is called SOC.

Figure 4:
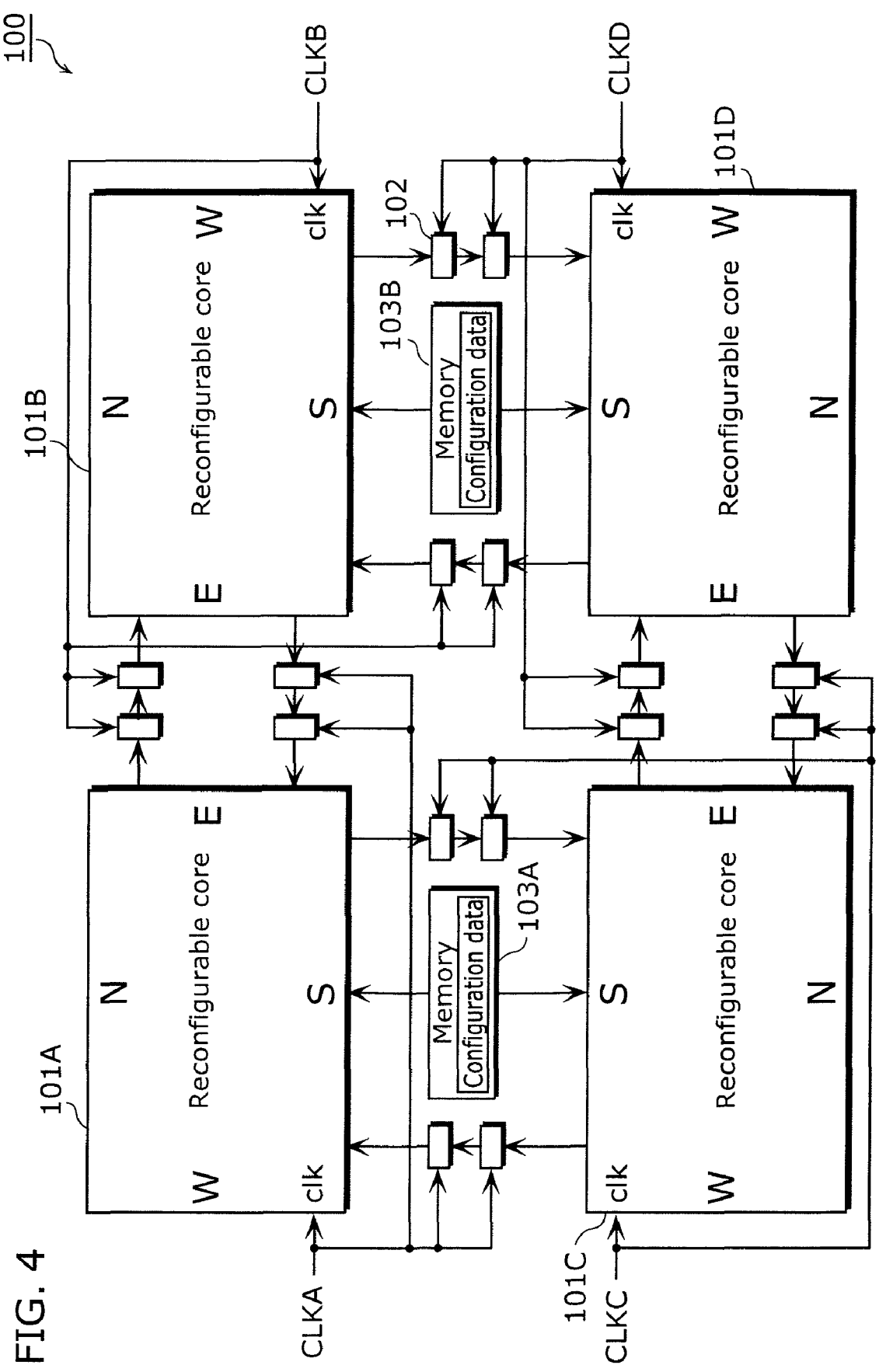
FIG. 4 shows a structure of a reconfigurable logic semiconductor integrated circuit according to the first embodiment of the present invention.

FIG. 4 shows a structure of a reconfigurable logic semiconductor integrated circuit 100 according to the first embodiment of the present invention. The semiconductor integrated circuit 100 shown in FIG. 4 is a reconfigurable logic semiconductor integrated circuit. The semiconductor integrated circuit 100 has four reconfigurable cores 101A, 101B, 101C, and 101D, a plurality of register circuits 102, and two memories 103A and 103B.

The reconfigurable cores 101A, 101B, 101C, and 101D are circuits each of which has a logic reconfiguration function. Hereinafter, the reconfigurable cores 101A, 101B, 101C, and 101D are referred to as reconfigurable cores 101 when they are mentioned with no specific distinction. The reconfigurable cores 101 are circuits that are capable of reconfiguring the logic thereof by changing connections therein according to configuration data inputted from outside the cores. Some sets of such configuration data may be preliminarily stored inside the reconfigurable cores 101.

Each of the reconfigurable cores 101 is rectangular with four sides of north (N), south (S), east (E), and west (W). The reconfigurable cores 101 are not symmetric with respect to these sides. Inner wiring thereof is structured differently between in an east-west direction and in a north-south direction. In the first embodiment, it is assumed that the configuration data to reconfigure the logic of the reconfigurable cores 101 is inputted from a direction of the S. Each of the reconfigurable cores 101 is handled as a hard macro in chip designing so that the multiple cores can be easily installed on a single chip.

The reconfigurable cores 101 operate synchronously with clock signals. In the first embodiment, the reconfigurable cores 101 are provided with clock signals CLKA, CLKB, CLKC, and CLKD, respectively.

Figure 5:
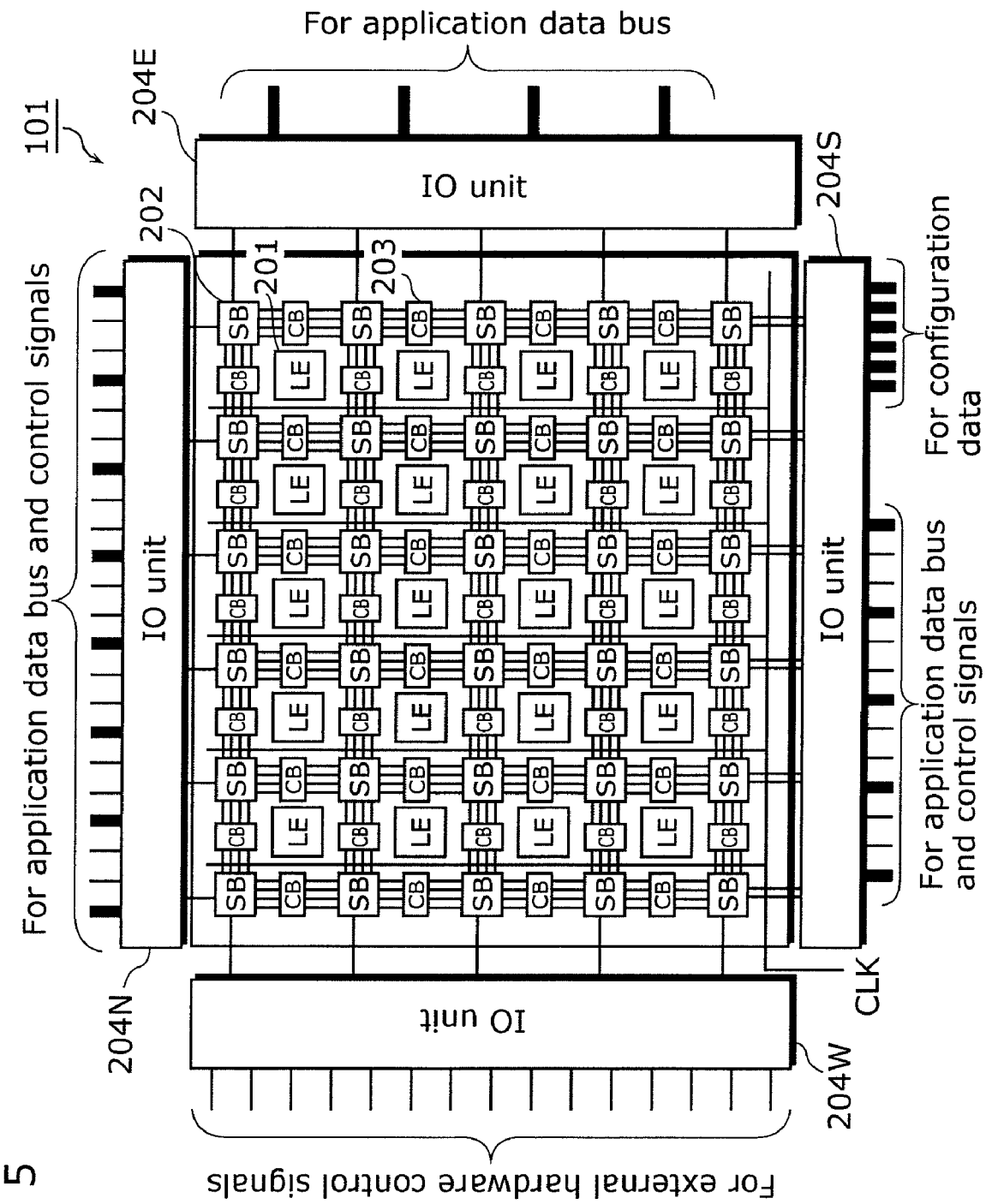
FIG. 5 shows a structure of reconfigurable cores according to the first embodiment of the present invention.

FIG. 5 shows a structure of the reconfigurable cores 101 (101A, 101B, 101C, and 101D). Each of the reconfigurable cores 101 has a plurality of logic elements (LE) 201, a plurality of switch boxes (SB) 202, a plurality of groups of circuit boxes (CB) 203, IO units 204N, 204S, 204E, and 204W, and a group of lines stretching in rows and columns.

The logic elements 201 are arranged in a matrix and implement predetermined logic respectively. The logic elements 201 are functional elements that allow for changing functions thereof (the relation of output to input) according to the configuration data. The switch boxes 202 determine interconnections of the lines according to the configuration data. The groups of circuit boxes 203 determine connections of inputs and outputs of the logic elements 201 to the lines according to the configuration data.

The connection of an output terminal of which logic element 201 to an input terminal of which logic element 201 is determined by controlling relation of connections in the switch boxes 202 and the groups of the circuit boxes 203. In the first embodiment, the switch boxes 202 and the groups of the circuit boxes 203 are collectively referred to as programmable wiring. The reconfigurable core 101 is provided with a clock-signal line therein in addition to the programmable wiring.

The IO units 204N, 204S, 204E, and 204W are input and output circuits disposed on the sides to the directions of north, south, east, and west of the reconfigurable core 101, respectively.

The IO unit 204N is disposed on the N side of the reconfigurable core 101. The IO unit 204N has input and output terminals for an application data bus and control signals.

The IO unit 204E is disposed on the E side of the reconfigurable core 101. The IO unit 204E has input and output terminals for an application data bus.

The IO unit 204S is disposed on the S side of the reconfigurable core 101. The IO unit 204S has input and output terminals for an application data bus and control signals. The IO unit 204S further has input and output terminals for configuration data.

The IO unit 204W is disposed on the W side of the reconfigurable core 101. The IO unit 204W has input and output terminals for control signals.

The input and output terminals for the application data buses are used for input and output of a calculation result to and from other reconfigurable cores 101, the CPU 10, the DMA 12, and the hardware circuit 13. The input and output terminals for control signals are used for input and output of a control signal to and from external hardware such as the CPU 10, the DMA 12, and the hardware circuit 13. The input and output terminals for the configuration data are used for input of the configuration data from the memories 103A and 103B.

This structure where the configuration data is inputted from only one direction S simplifies the wiring structure of the reconfigurable core 101. Furthermore, disposing the IO units with the input and output terminals arranged differently on the sides of the reconfigurable core 101 achieves layouts suited for applications.

Figure 6:
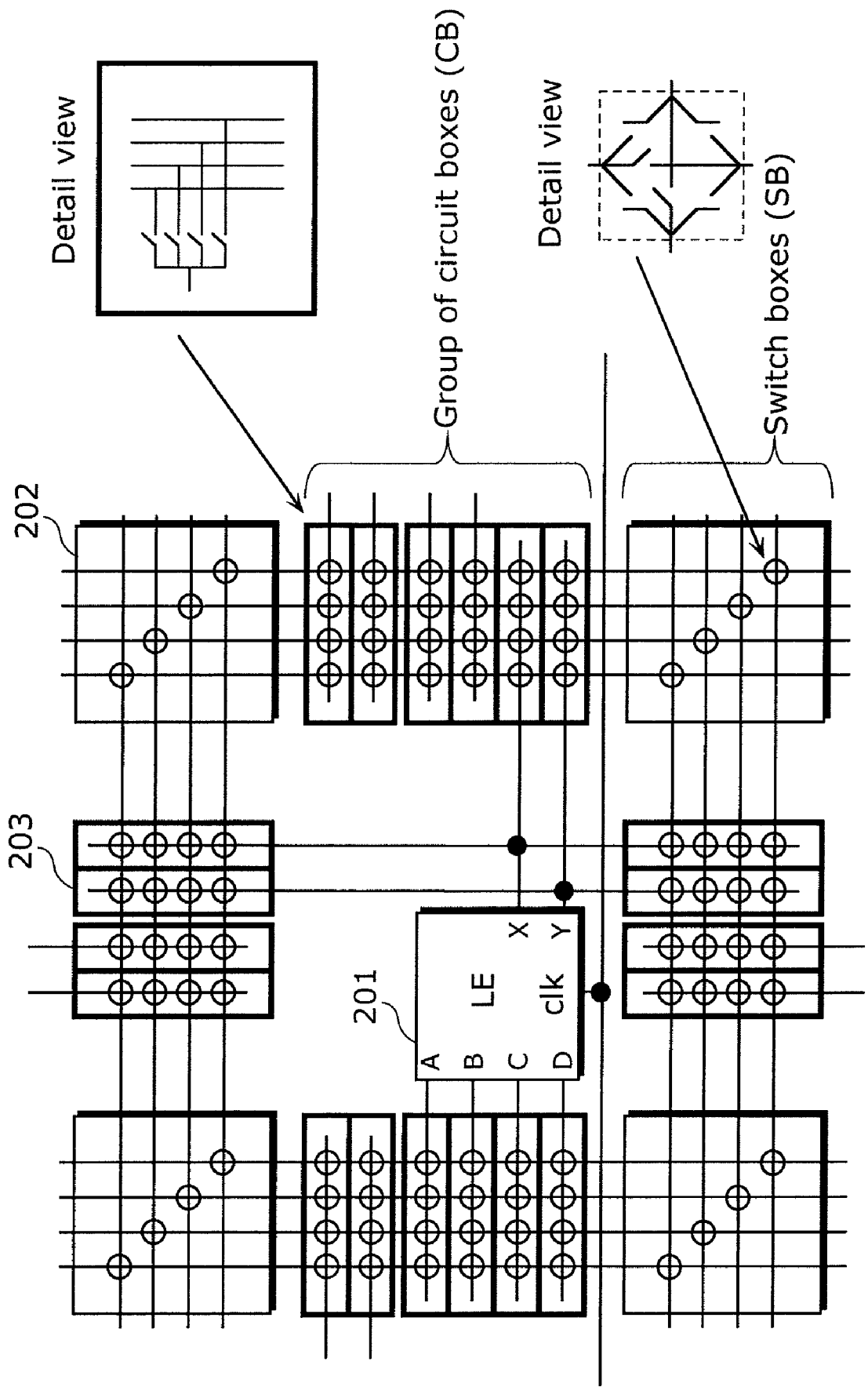
FIG. 6 shows a surrounding structure of a logic element according to the first embodiment of the present invention.

FIG. 6 illustrates the inside of the reconfigurable cores 101 in further detail. Shown in FIG. 6 is a structure where one logic element 201 is surrounded with the switch boxes 202 and the groups of the circuit boxes 203.

In the first embodiment, the logic element 201 is a functional element with four input terminals on the west side and two output terminals on the east side. The groups of the circuit boxes 203 programmably determine connections of the input and output terminals of the logic element stretching in the east-west direction to the lines stretching in the north-south direction.

The switch boxes 202 programmably connect the lines stretching in the east-west direction and the lines stretching in the north-south direction. The output terminals of the logic element 201 connected to the lines in the north-south direction may be connected to the lines in the east-west direction via the group of the circuit boxes. The logic element 201 is provided with a clock signal through a line different from the programmable wiring.

Figure 7:
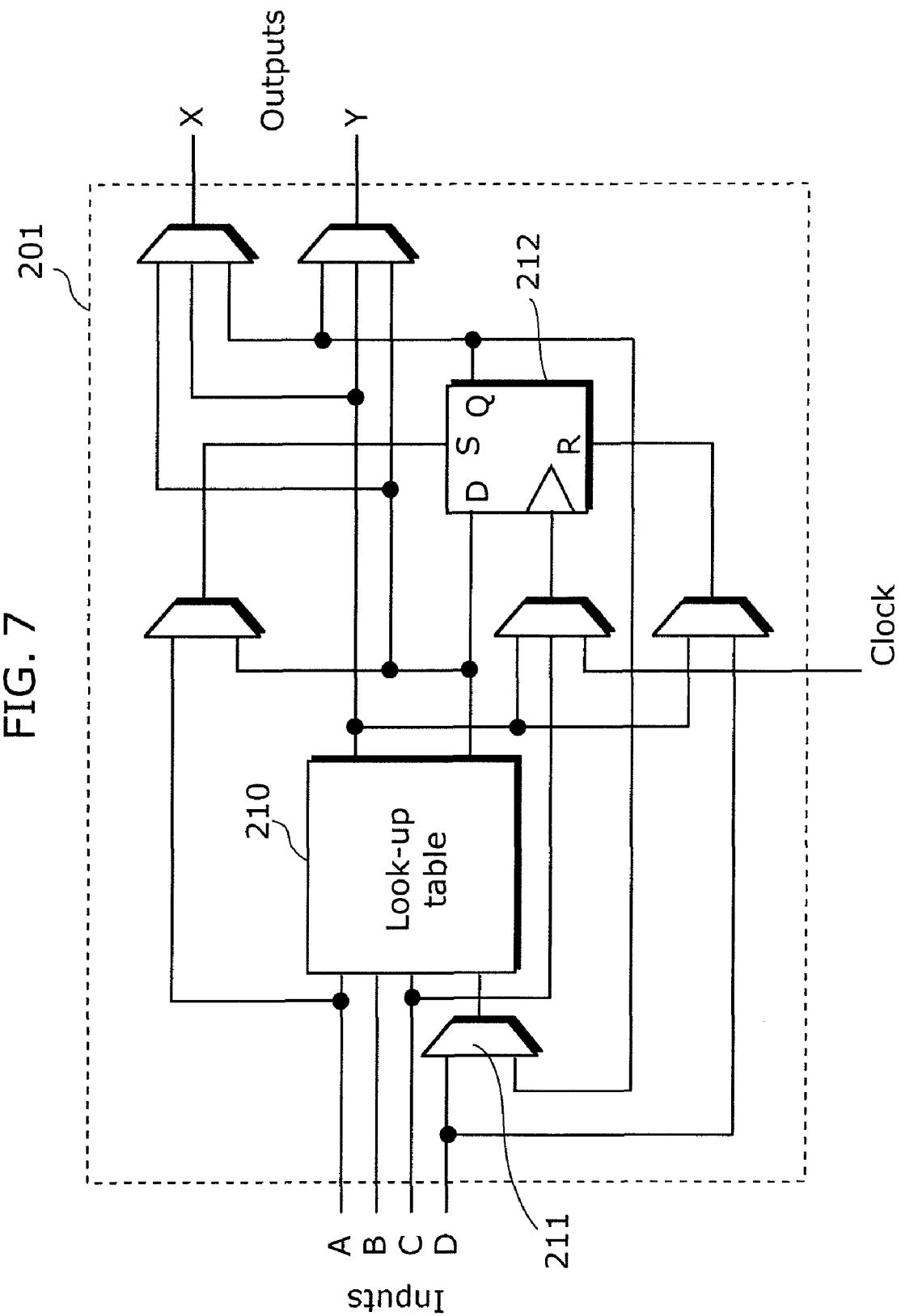
FIG. 7 shows a structure of a logic element in detail according to the first embodiment of the present invention.

FIG. 7 shows a structure of the logic element 201 in detail. In the first embodiment, the logic element 201 has a look-up table (LUT) 210, a plurality of programmable multiplexers 211, and a flip-flop 212. The look-up table 210 is composed of small-size memories. The relation of outputs to inputs of the look-up table 210 is changed by rewriting content held in the memories. A signal selected by each of the plurality of programmable multiplexers 211 is determined according to the configuration data or an output from another logic element 201.

Each of the reconfigurable cores 101 has such a configuration where the plurality of logic elements 201 is arranged in a matrix as shown in FIGS. 5 to 7 that the density of the programmable wiring to interconnect the logic elements 201 is high in the reconfigurable core 101. The wiring from the IO units for the application data buses, control signals, and configuration data is relatively less dense at a boundary between the reconfigurable core 101 and outside thereof. In addition to the wiring from the IO units, there is wiring in a gap area between reconfigurable cores 101 to connect them with another circuit block on the same chip as the semiconductor integrated circuit 100. In other words, the reconfigurable cores 101 are separate from one another on a chip layout, and wiring structures are obviously different between inside and outside of the reconfigurable cores 101.

This is described below with reference to FIG. 4 again. The memories 103A and 103B temporarily store the configuration data to be inputted in the reconfigurable cores 101. Hereinafter, the memories 103A and 103B are referred to as memory (or memories) 103 when they are mentioned with no specific distinction. The memory 103A stores the configuration data for reconfiguring logic of the reconfigurable cores 101A and 101C. The memory 103B stores the configuration data for reconfiguring logic of the reconfigurable cores 101B and 101D. The memory 103A is disposed between the reconfigurable cores 101A and 101C. The memory 103B is disposed between the reconfigurable cores 101B and 101D.

One of features of the present invention is that the reconfigurable cores 101A and 101C are disposed with the S sides thereof facing each other. The reconfigurable cores 101B and 101D are disposed with the S sides thereof facing each other. This layout allows disposing the memories 103 collectively to make chip design easier because the configuration data is inputted only from the S sides. Furthermore, lengths of lines from the memories 103 to the reconfigurable cores 101 may be shortened. This enables dynamic reconfiguration of functions of the reconfigurable cores in a short period of time. It is noted that the memory 103 and the reconfigurable core 101 are interconnected using a multi-bit bus not shown in the figure.

The reconfigurable cores 101A and 101B are disposed with the E sides thereof facing each other. The reconfigurable cores 101C and 101D are disposed with the E sides thereof facing each other. As mentioned above, the E side of the reconfigurable core 101 is provided with IO units for an application data bus thereon. Here, it is usually preferable to reduce wiring delay in the application data bus. On the other hand, wiring delay has relatively little impact on signal lines for control signals. A line length of the application data bus between the reconfigurable cores 101 may be thus shortened by disposing the reconfigurable cores 101 with the E sides thereof facing each other. The impact of wiring delay in the application data bus may be reduced thereby.

Another feature of the present invention is that the reconfigurable logic semiconductor integrated circuit 100 has two register circuits 102 in series in each gap between the reconfigurable cores 101 side by side to each other in rows and columns.

Each register circuit 102 is composed of a plurality of flip-flops and may hold some sets of multi-bit (for example, 16-bit) data. A pair of the two register circuits in series are formed in every gap between the side-by-side reconfigurable cores 101. Each pair of the two register circuits 102 in series temporarily holds output from a reconfigurable core 101 that is a data source and transfers it to another reconfigurable core 101 that is a data destination. A first-stage register circuit 102 of the two serial register circuits 102, synchronously with the clock signal, holds data outputted from the reconfigurable core 101 that is the data source and outputs the data to a second-stage register circuit 102. A second-stage register circuit 102 of the two serial register circuits 102, synchronously with the clock signal, holds the data outputted from the first-stage register circuit 102 and outputs the data to the reconfigurable core 101 that is the data destination.

Additionally, the gap between two side-by-side reconfigurable cores 101 has a pair of two register circuits 102 in series that temporarily holds output from a first reconfigurable core 101 and transfers it to a second reconfigurable core 101, and a pair of two register circuits 102 in series that temporarily holds output from the second reconfigurable cores 101 and transfers it to the first reconfigurable core 101.

Each of the reconfigurable cores 101 transmits and receives data through the two register circuit in serial. This makes each of the reconfigurable cores 101 a separate circuit. Even when the reconfigurable logic semiconductor integrated circuit 100 is a large-scale circuit, each of the reconfigurable cores 101 is a separate circuit that is one-fourth of the reconfigurable logic semiconductor integrated circuit 100. This will limit the combinations for mapping in each of the reconfigurable cores 101 even in the case of mapping of a large-scale circuit function. The circuit function is thus mapped rapidly. Mapping is described later in detail.

The two register circuits 102 are formed in series in order to ease a timing constraint because of the delay due to the line length. Only with a single register circuit 102, the timing constraint is severe in the case where, for example, the register circuit 102 may be required to latch, on a clock edge, data outputted from the farthest logic element 201 in the reconfigurable core 101 that is a data source, and on the next clock edge output the data to the farthest logic element 201 in the reconfigurable core 101 that is a data destination. This constraint is eased by forming two register circuits in series. For example, the first-stage register circuit 102 of the two register circuits in series formed nearer to the reconfigurable core 101 that is the data source, and the second-stage register circuit 102 nearer to the reconfigurable core 101 that is the data destination.

It is also noted that clock signals to be inputted to the register circuits 102 and to be inputted to the reconfigurable core 101 that is the data destination is common. For example, the register circuits 102 formed on the route through which data is transferred from the reconfigurable core 101A to the reconfigurable core 101C are provided with a clock signal CLKC as the reconfigurable core 101C is provided with. This enables at least the second-stage register circuit 102 to securely hold the data even when the reconfigurable cores 101 are operated asynchronously. Accordingly, metastability (a state where a setup constraint or a hold constraint is not satisfied) that occurs when the reconfigurable cores 101 are operated asynchronously is avoided in the semiconductor integrated circuit 100.

Hereinafter, a method is described for mapping a circuit function on the reconfigurable logic semiconductor integrated circuit 100 according to the first embodiment of the present invention using a mapping apparatus. The configuration data held in the memory 103 is generated through mapping.

Figure 8:
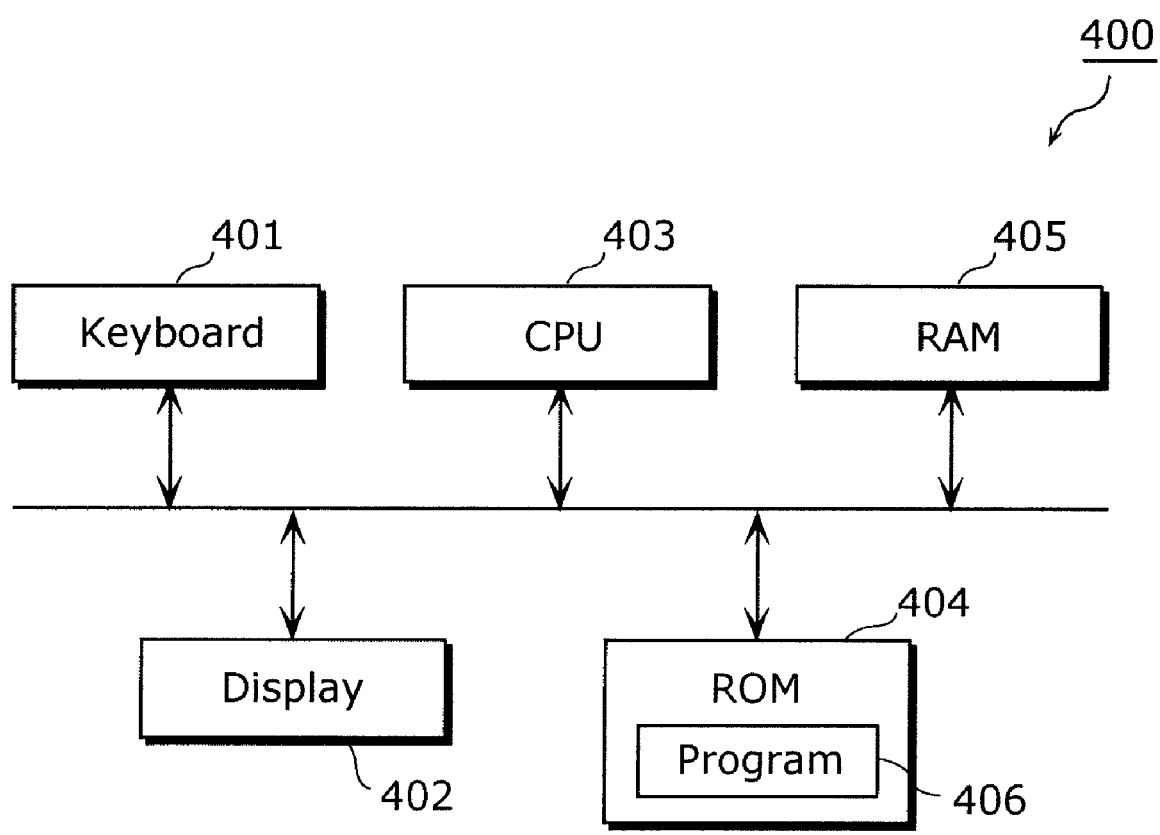
FIG. 8 shows a configuration of a mapping apparatus according to the first embodiment of the present invention.

FIG. 8 shows a hardware configuration of a mapping apparatus according to the first embodiment of the present invention. The mapping apparatus 400 shown in FIG. 8 maps a circuit function described in a circuit description on the semiconductor integrated circuit 100 mentioned above. The mapping apparatus 400 may be, for example, a personal computer. The mapping apparatus 400 has a keyboard 401, a display 402, a CPU 403, a ROM 404, and a RAM 405.

The keyboard 401 receives an operation by a designer. The display 402 shows the designer a process result. The CPU 403 performs an entire control of the mapping apparatus 400 by executing a program 406 stored in the ROM 404. The ROM 404 is a read-only memory that stores the program 406 to be executed by the CPU 403. The program 406 may be stored in a non-volatile memory or a hard disk (HD) not shown in the figures. The RAM 405 is a readable and writable memory to store working data to be used in the execution of the program 406 by the CPU 403.

With the configuration described above, when the CPU 403 of the mapping apparatus 400 executes the program 406, the circuit function described in the circuit description is mapped on the semiconductor integrated circuit 100.

The mapping by the mapping apparatus 400 may be achieved by a special hardware.

Figure 9:
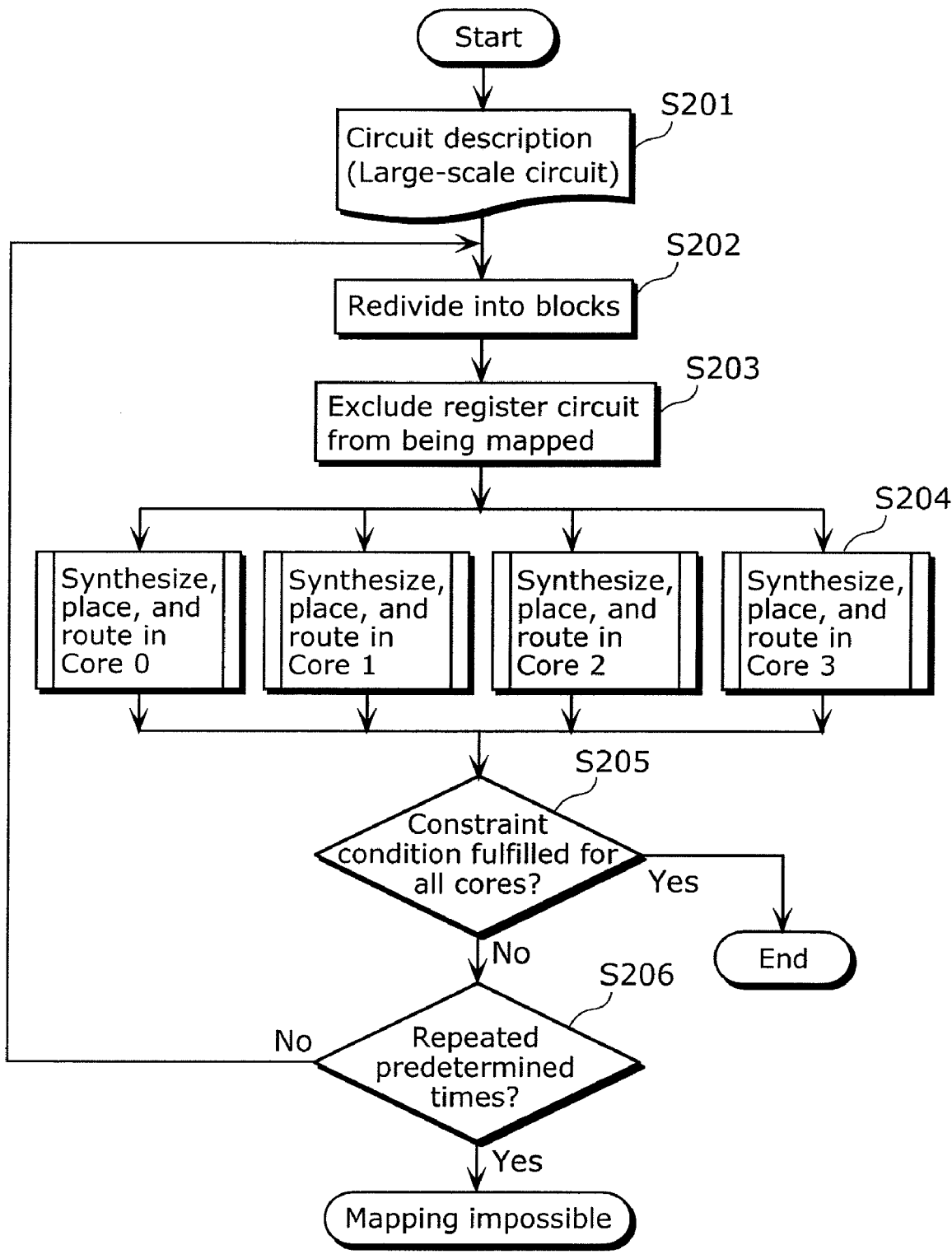
FIG. 9 is a flowchart of mapping of a circuit function according to the first embodiment of the present invention.

FIG. 9 is a flowchart of mapping of the circuit function on the semiconductor integrated circuit 100.

First, the designer describes a circuit function to be mapped on the reconfigurable logic semiconductor integrated circuit 100 (S201). The circuit function is described in a hardware description language such as HDL or a high-level language such as C language. When describing the circuit function, the designer divides a large-scale circuit function into a plurality of process modules with two cycles of delay inserted between the process modules. This allows the process modules to have pairs of two serial register circuits inserted between the process modules.

Next, the mapping apparatus 400 divides the circuit function in the circuit description described by the designer into a plurality of circuit function blocks (S202). Specifically, the mapping apparatus 400 integrates the process modules in the circuit description and redivides them into four blocks. The mapping apparatus assigns the divided blocks to the four reconfigurable cores 101. The mapping apparatus 400 then excludes the pairs of two serial registers in the gaps between the four blocks from being mapped on the reconfigurable cores 101 in order to save the registers for assignment to the register circuit 102.

A detailed example of the process of the steps S202 and S203 executed by the mapping apparatus 400 is described below with reference to FIG. 10.

Figure 10:
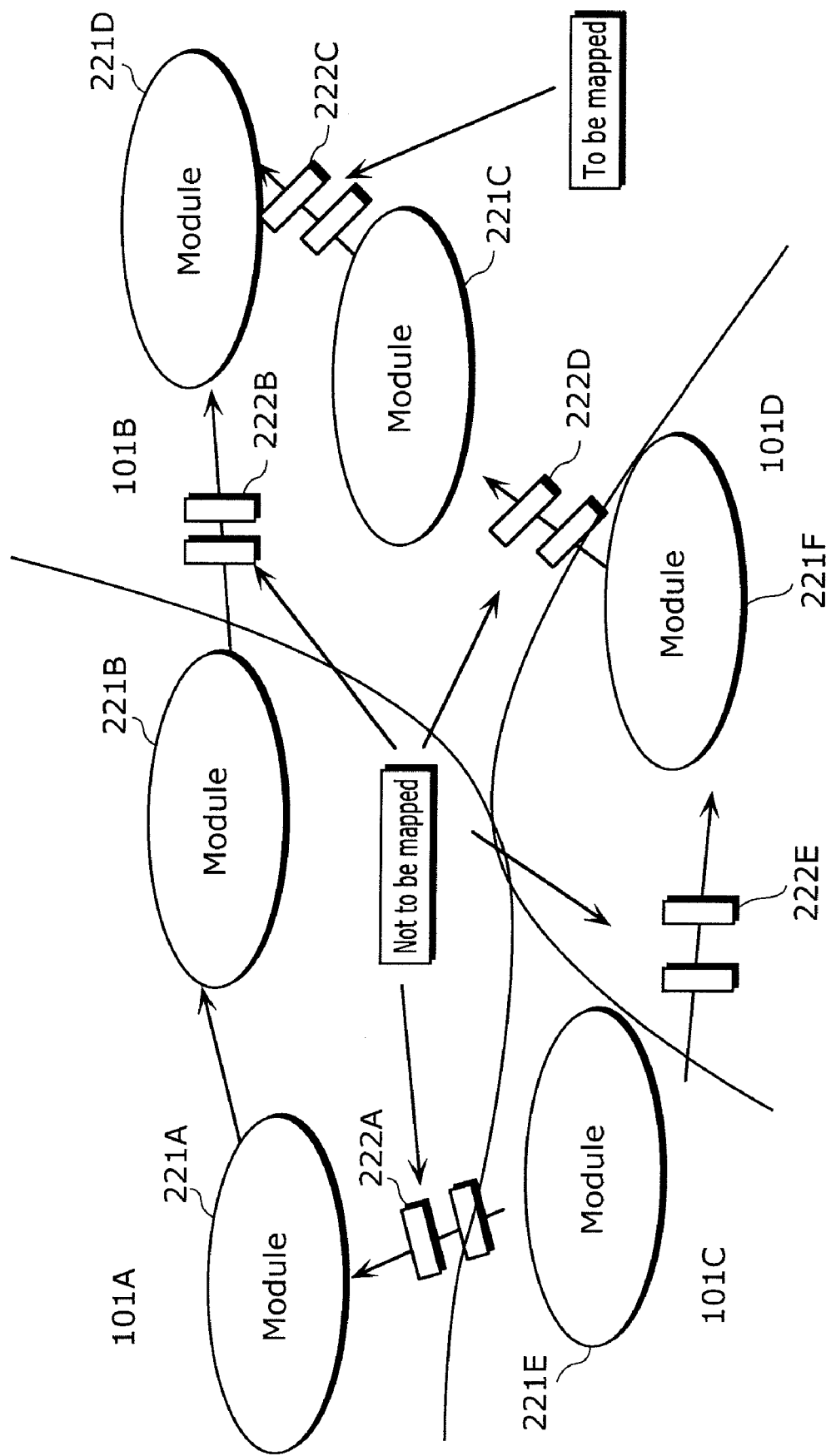
FIG. 10 illustrates assignment to each of the reconfigurable cores in mapping of circuit functions according to the first embodiment of the present invention.

FIG. 10 illustrates assignment process to each of the reconfigurable cores 101 in the step S202 and assignment to the register circuits 102 in the step S203.

The process described below with reference to FIG. 10 is executed by the mapping apparatus 400. The designer has divided a circuit description for a large-scale circuit into six process modules of modules 221A to 221F and entered them into the mapping apparatus 400. The large-scale circuit receives data through the module 221E and executes predetermined arithmetic process on the data to output a result of the arithmetic process from the module 221D. The designer has described the circuit description (including two cycles of delay) so that pairs of two registers can be inserted in series between the modules. However, such registers are not inserted between the modules 221A and 221B because of a constraint in an algorism of the arithmetic process.

In the step S202, the mapping apparatus 400 divides the circuit description into four blocks in consideration of scale and speed of the circuit of each process module. Furthermore, the mapping apparatus 400 assigns the divided blocks to the reconfigurable cores. For example, the mapping apparatus 400 assigns the modules 221A and 221B to the reconfigurable core 101A, modules 221C and 221D to the reconfigurable core 101B, the module 221E to the reconfigurable core 101C, and the module 221F to the reconfigurable core 101D.

In the step S203, the mapping apparatus 400 assigns the register 222A between the modules 221A and 221E to the register circuit 102 installed in the gap between the reconfigurable cores 101A and 101C. The mapping apparatus 400 assigns the register 222B between the modules 221B and 221D to the register circuit 102 installed in the gap between the reconfigurable cores 101A and 101B. The mapping apparatus 400 assigns the register 222D between the modules 221C and 221F to the register circuit 102 installed in the gap between the reconfigurable cores 101B and 101D. The mapping apparatus 400 assigns the register 222E between the modules 221E and 221F to the register circuit 102 installed in the gap between the reconfigurable cores 101C and 101D. The mapping apparatus 400 excludes registers 222A, 222B, 222D, and 222F assigned to the register circuits 102 from being mapped.

Meanwhile, the mapping apparatus 400 does not exclude the register 222C installed between the modules 221C and 221D that are assigned to the single reconfigurable core 101B from being mapped to the reconfigurable cores 101.

Figure 11:
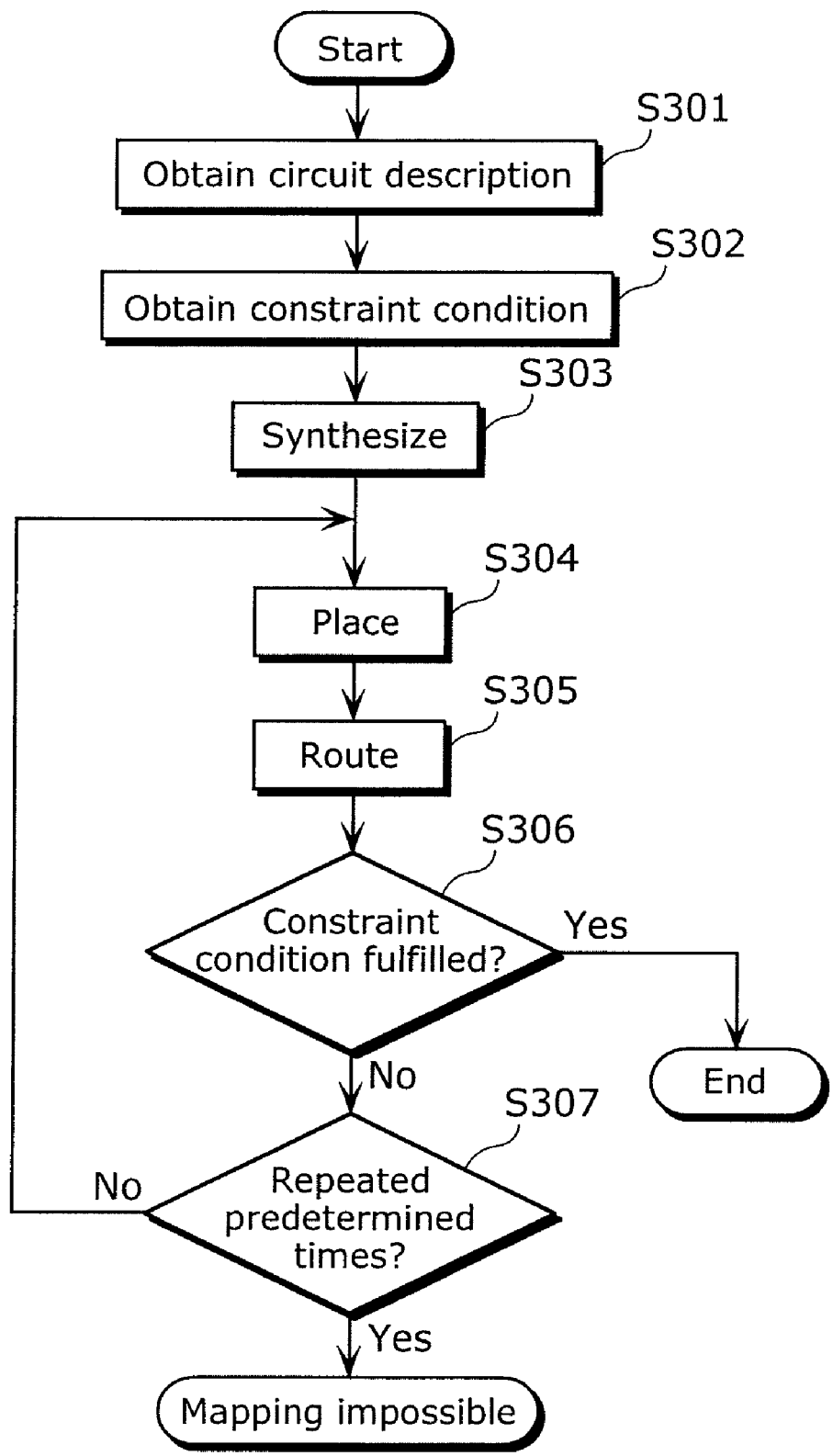
FIG. 11 is a flowchart of mapping of a circuit function on one reconfigurable core in the mapping of the circuit function according to the first embodiment of the present invention.

Next, the mapping apparatus 400 maps the circuit function assigned to each of the reconfigurable cores 101 thereon (S204). FIG. 11 is a flowchart that shows a flow of mapping of the circuit function on one reconfigurable core 101 in the step S204.

First, the mapping apparatus 400 obtains the circuit description of the block into which the circuit function has been divided in the step S202 and between which the register is eliminated from in the step S203 (S301).

Next, the mapping apparatus 400 obtains a constraint condition for mapping (S302). For example, the constraint condition may be about speed and area, and may be entered into the mapping apparatus 400 by the designer.

The mapping apparatus 400 then executes logic synthesis of the circuit description obtained in the step S301 (S303). Specifically, the mapping apparatus 400 divides the circuit function described in the circuit description into functional units. Each of the functional units can be assigned to one of the logic elements 201. The mapping apparatus 400 determines connections between the divided functional units. Subsequently, the mapping apparatus 400 places the divided functional units on the logic elements 201 in an actual circuit (S304). A function (relation of output to input) of each logic element 201 is thus determined.

Following this, the mapping apparatus 400 routes the logic elements 201 using programmable wiring so that the connections determined by the logic synthesis are achieved (S305). The placing on the logic elements 201 and routing the logic elements using the programmable wiring may be executed as a single process or separated processes.

The mapping apparatus 400 then judges whether or not the circuit resulting from the placing and routing fulfills the constraint condition obtained in the step S302 (S306). When the constraint condition is fulfilled (Yes in S306), the synthesis of the block, placing, and routing is completed. When the constraint condition is not fulfilled (No in S306), the mapping apparatus subsequently judges whether or not the process from the steps S304 to S306 has been repeated a predetermined times (S307). When the process has not been repeated the predetermined times (No in S307), the mapping apparatus 400 executes the placing and routing process (S304 and S305) again. The mapping apparatus 400 repeats the placing and routing process (S304 and S305) until the constraint condition is fulfilled. When the constraint condition is not fulfilled even after the process has been repeated the predetermined times (Yes in S307), the mapping apparatus 400 ends the process with a result that the mapping on the blocks is impossible.

The process may be repeated from synthesis (S303) through placing and routing (S304 and S305) when the constraint condition is not fulfilled (No in S306).

The mapping apparatus 400 may display an indication that the constraint condition cannot be fulfilled when such is the case even after repeating the process the predetermined times. Upon the indication, the designer will review the constraint condition. The mapping apparatus will then obtain a newly entered constraint condition (S302) and executes the process of steps S303 to S306 under the new constraint condition.

The mapping apparatus 400 maps one divided circuit function on each of the reconfigurable cores 101, so that the process is converged in a short period of time in comparison with conventional mapping through which a large-scale circuit description is mapped on a large-scale reconfigurable core.

The mapping apparatus 400 then judges whether or not the constraint condition is fulfilled for all of the four reconfigurable cores 101 (S205). When it is (Yes in S205), the mapping of the circuit description for the large-scale circuit is completed.

When the constraint condition is not fulfilled for any one or more of the reconfigurable cores 101 (No in S205), the mapping apparatus 400 judges whether or not the mapping process of the steps S202 to S204 has been repeated the predetermined times (S206). When the process has not been repeated the predetermined times (No in S206), the mapping apparatus 400 executes the process from the step S202 again. When the process has been repeated the predetermined times (Yes in S206), the mapping apparatus 400 judges that the circuit function described in the step S201 cannot be mapped on the reconfigurable logic semiconductor integrated circuit 100.

There are two methods for the process of the steps S202, S203, S205, and S 206: one is a method in which the process is executed by the mapping apparatus 400 using a special point tool included in the program 406; the other is a method in which the process is executed as part of a synthesis tool. The process of S204 can be executed by the mapping apparatus 400 using a synthesis tool and a P & R tool similar to those included in the program 406.

As described above, with the reconfigurable logic semiconductor integrated circuit 100 according to the first embodiment of the present invention where two registers in series are inserted for each process module of a large-scale circuit function, the mapping apparatus 400 can handle each of the reconfigurable cores 101 as a separate circuit in execution of mapping. The mapping will be thus completed in a short period of time.

In addition, the semiconductor integrated circuit 100 can operate as fast as a single large-scale reconfigurable logic semiconductor integrated circuit because the register circuits 102 are installed in the same chip as the reconfigurable cores 101 and driven by the same clock signal as provided for the reconfigurable cores 101.

The description above is the best mode for carrying out the present invention. Needless to say, however, the present invention is not limited to the embodiment above. For example, the following description is a possible variation.

It is also possible to form three or more register circuits 102 in series. In this case, when the reconfigurable cores 101 are provided with asynchronous clock signals, at least two posterior, second- and third-stage register circuits 102 are preferably provided with the same clock signal as the reconfigurable core 101 that is a data destination for anti-metastability purpose.

It is also possible to form only one register circuit 102 between two reconfigurable cores. As described above, the timing constraint is severe with a single register circuit 102. However, the timing constraint may be obeyed even with the single register circuit 102 when distance between the reconfigurable cores 101 is short and the reconfigurable cores 101 are of a small scale. In the case where the register circuit 102 is single, the register circuit 102 is preferably disposed equally away from the reconfigurable core 101 that is a data source and the reconfigurable core 101 that is a data destination.

Although each of the reconfigurable cores 101 are provided with different clock signals CLKA, CLKB, CLKC, and CLKD in the description above, these clock signals may be the same one in order to simplify a structure of the semiconductor integrated circuit. It is also possible that two or more of the plurality of reconfigurable cores are provided with the same clock signal.

Although every gap between the side-by-side reconfigurable cores 101 has the two register circuits 102 in series, it is also possible that only one or more gaps between the side-by-side reconfigurable cores 101 have such a pair of the register circuits. It is also possible to form only the register circuits 102 for holding data transmitted from a first reconfigurable core 101 to a second reconfigurable core 101 of two side-by-side reconfigurable cores 101, but not the register circuits 102 for holding data transmitted from the second reconfigurable core 101 to the first reconfigurable core 101.

The two register circuits 102 in series may be formed between two reconfigurable cores 101 that are not arranged side by side. For example, it is also possible to form the register circuits 102 in series between the reconfigurable cores 101A and 101D. It is also possible to form the two register circuits 102 in series between the reconfigurable cores 101B and 101B.

Although the semiconductor integrated circuit 100 according to the first embodiment of the present invention is described to be configured as a single circuit block on a what is called SOC, the semiconductor integrated circuit 100 per se may be also configured as a single-chip large scale integration (LSI).

It is also possible to use not an LUT but one or a plurality of ALUs as the logic elements 201. Signal processing operation for image encoding and decoding or cryptographic processing is usually composed of repetitive simple calculations. Consequently, using one or the plurality of ALUs as the logic elements 201 may provide a reconfigurable core 101 suitable for such signal processing operation. Using such a reconfigurable core 101 that uses an ALU as the logic elements 201 is preferable especially when configuring the reconfigurable logic semiconductor integrated circuit 100 according to the present invention as a single circuit block on a SOC because this will make it possible to have only the CPU 10 execute process of control system. When various signal processes need to be carried out on a conventional SOC, special hardware has been designed for each of the signal process. With one or a plurality of ALUs as the logic elements 201 and an SOC that includes the CPU 10, the reconfigurable logic semiconductor integrated circuit 100 can execute all the processes without special hardware.

For some circuit functions to be achieved on the reconfigurable logic semiconductor integrated circuit 100, not all the reconfigurable cores 101 are necessarily used for achieving one circuit function. It is also possible to map one circuit function using some of the reconfigurable cores 101. The rest of the reconfigurable cores may be mapped on with another circuit function.

Although the reconfigurable cores 101A, 101B, 101C, and 101D are described to have the same structure, they may have different structures. For example, the number of logic elements 201 may be different among the reconfigurable cores 101.

Each of the reconfigurable cores 101 may be either of the dynamically reconfigurable core 101 that allows dynamic logic reconfiguration with power on, or a what is called FPGA that needs logic reconfiguration with power off.

The configuration of the four IO units included in the reconfigurable cores 101 is not limited to that shown in FIG. 5. The units may have any configuration as long as the configuration data is to be inputted from the S side.

Although the process of the steps S201 to S206 shown in FIG. 9 is described to be executed by the mapping apparatus 400, part of the process may be executed and inputted into the mapping apparatus 400 by the designer.

Although the semiconductor integrated circuit 100 is described to exemplarily have four of the reconfigurable cores 101, the semiconductor integrated circuit 100 may have more than one reconfigurable cores. For example, the semiconductor integrated circuit 100 may have two, three, or no less than five reconfigurable cores 101.

Figure 12:
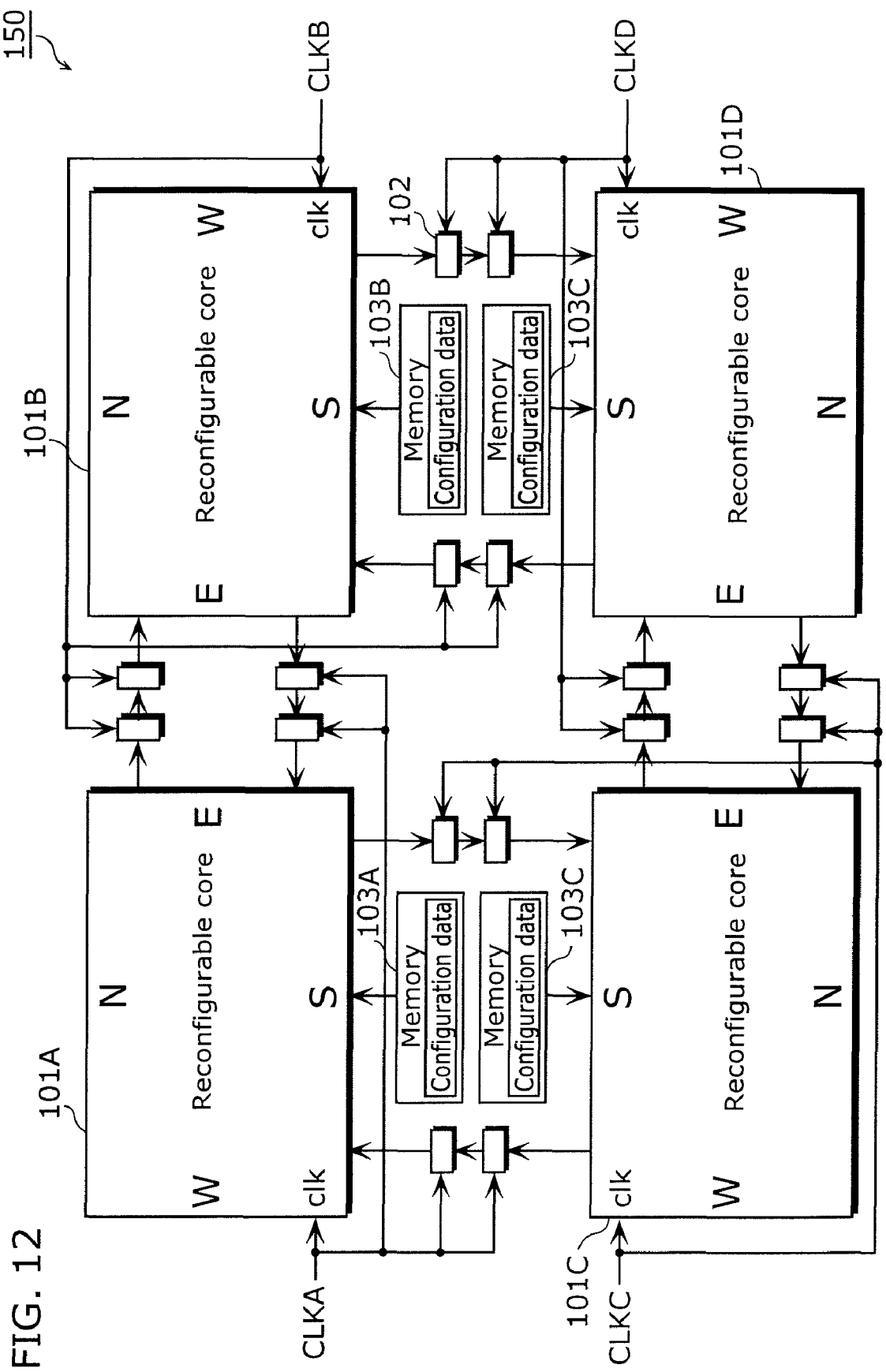
FIG. 12 shows a structure of a variation of the semiconductor integrated circuit according to the first embodiment.

Unlike the structure shown in FIG. 4 where one memory 103 is provided for each pair of the reconfigurable cores 101 with the S sides thereof facing each other, it is also possible to provide each reconfigurable core 101 with one memory 103. FIG. 12 shows a variation of the semiconductor integrated circuit 100 according to the first embodiment. The semiconductor integrated circuit 150 has a structure shown in FIG. 12 in which each of the reconfigurable cores 101 has one memory 103. The semiconductor integrated circuit 150 shown in FIG. 12 has four memories of 103A, 103B, 103C, and 103D. The memory 103A stores configuration data to be inputted into the reconfigurable core 101A. The memory 103B stores configuration data to be inputted into the reconfigurable core 101B. The memory 103C stores configuration data to be inputted into the reconfigurable core 101C. The memory 103D stores configuration data to be inputted into the reconfigurable core 101D. This structure allows parallel configuration for all the reconfigurable cores 101 and the configuration is completed in a short period of time.

Second Embodiment

The semiconductor integrated circuit according to the second embodiment of the present invention has a function to stop providing the register circuits 102 and the reconfigurable cores 101 with the clock signals. This will reduce excess power consumption.

Figure 13:
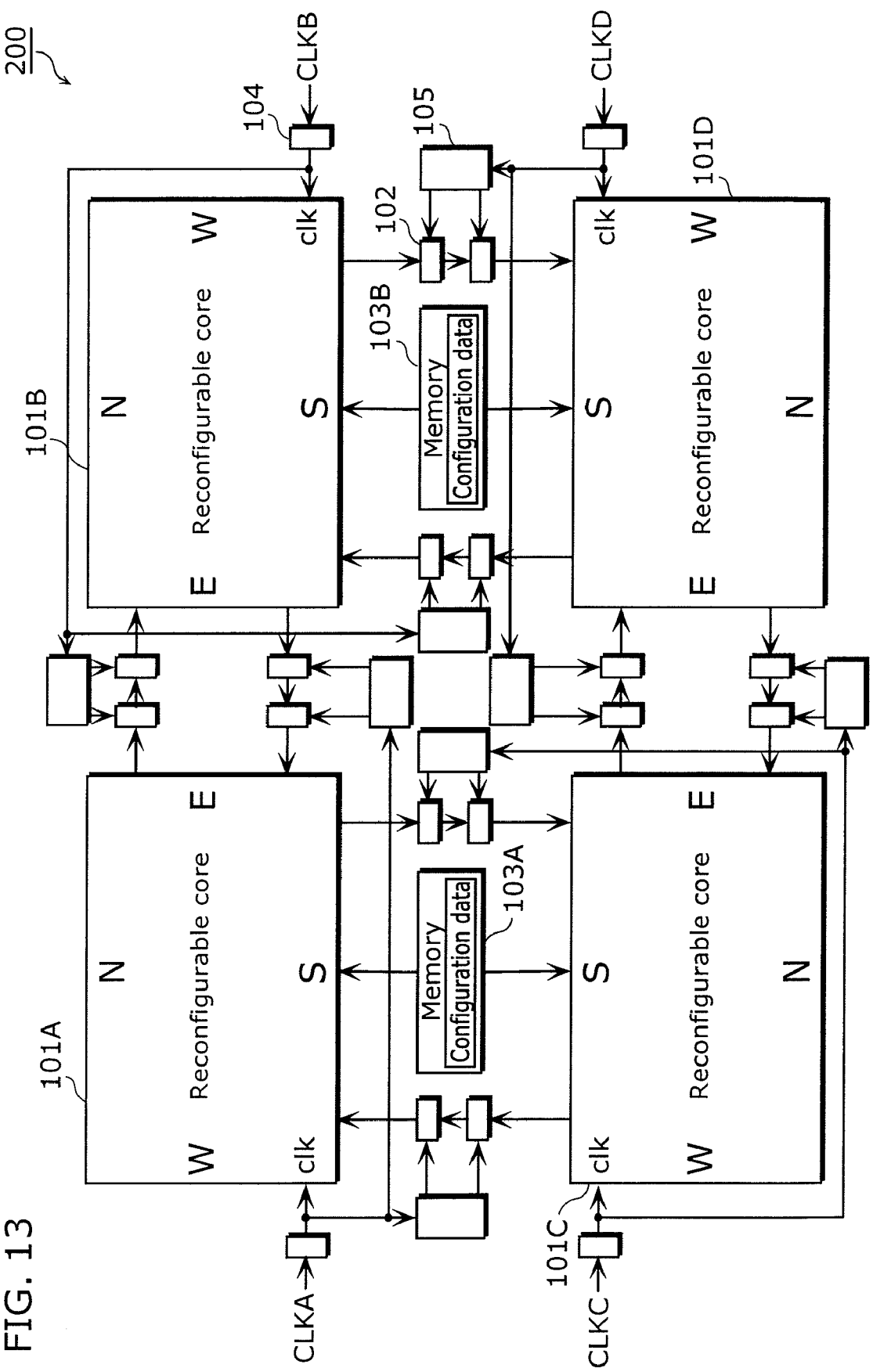
FIG. 13 shows a structure of a semiconductor integrated circuit according to the second embodiment of the present invention.

FIG. 13 shows the structure of a semiconductor integrated circuit according to the second embodiment of the present invention.

The semiconductor integrated circuit 200 shown in FIG. 13 has a plurality of first clock signal stopping circuits 104 and a plurality of second clock signal stopping circuit in addition to the structure of semiconductor integrated circuit 100 according to the first embodiment shown in FIG. 5. Elements in common with FIG. 5 are denoted by the same reference numerals and thus detailed description thereof is omitted.

The first clock signal stopping circuit 104 is formed corresponding to each of the plurality of the reconfigurable cores 101. The first clock signal stopping circuit 104 controls whether or not a clock signal is provided for the corresponding reconfigurable core 101. The first clock signal stopping circuit 104 stops providing the clock signal for the corresponding reconfigurable core 101 when the reconfigurable core 101 is not in use. The first clock signal stopping circuit 104 stops providing the clock signal for the register circuit 102 that is used for inputting the clock signal into the corresponding reconfigurable core 101 when the reconfigurable core 101 is not in use. For example, the first clock signal stopping circuit 104 stops providing the clock signal for the corresponding reconfigurable core 101 when the reconfigurable core 101 is reconfigured to include no circuit.

The second clock signal stopping circuit 105 is formed corresponding to each of the pairs of the two serial register circuits 102. The second clock signal stopping circuit 105 controls whether or not a clock signal is provided for the corresponding register circuits 102. The second clock signal stopping circuit 105 stops providing the clock signal the corresponding register circuits 102 when the register circuit 102 is not in use for signal transmission. For example, there may be no signal transmission between the reconfigurable cores 101A and 101B even while they are in operation. In such a case, the register circuits 102 between the reconfigurable cores 101A and 101B do not need to receive the clock signal. There may be no signal transmission from the reconfigurable core B to the reconfigurable core A even while there is in reverse direction. In this case, only providing the clock signals for the register circuits 102 inserted on the route of signal transmission from the reconfigurable core 101B to the reconfigurable core 101A is stopped.

The semiconductor integrated circuit 200 according to the second embodiment of the present invention thus stops providing the reconfigurable cores 101 not in use with clock signals. This will reduce excess power consumption. The semiconductor integrated circuit 200 also stops providing the register circuits 102 not in use with clock signals. This will reduce excess power consumption.

Although the semiconductor integrated circuit 200 shown in FIG. 13 has the first clock signal stopping circuit 104 for each of all the reconfigurable cores 101, the semiconductor integrated circuit 200 may have the first clock signal stopping circuit 104 for at least any one of the reconfigurable cores. In this case, mapping of the circuit function is preferentially executed for the reconfigurable core 101 having no corresponding first clock signal stopping circuit 101.

Although the semiconductor integrated circuit 200 shown in FIG. 13 has the second clock signal stopping circuit 105 for each pair of the register circuits 102, the semiconductor integrated circuit 200 may have the second clock signal stopping circuit 105 for at least any one pair of the register circuits 102.

Third Embodiment

For the mapping described in the first embodiment, the designer describes, in the circuit description, the process of inserting the two register circuits in series in the step S201 shown in FIG. 10. In the third embodiment described is a program transformation apparatus that executes process of inserting the two register circuits in series in the circuit description.

A function of program transformation apparatus according to the third embodiment of the present invention is achieved by a personal computer or the like that executes a program for it. For example, the program transformation apparatus according to the third embodiment has the same configuration as shown in FIG. 8. In other words, the function of the program transformation apparatus is achieved by the CPU 403 that executes the program 406 for it. The function of the program transformation apparatus according to the third embodiment may be achieved by special hardware.

The program transformation apparatus according to the third embodiment of the present invention transforms a circuit description similar to conventional ones into a status in which the circuit description can be mapped by the mapping apparatus 400 according to the first embodiment. The program transformation apparatus according to the third embodiment of the present invention selectively inserts the two register circuits in series between the process modules of the circuit description in which a single large-scale circuit function composed of the plurality of process modules is described.

Hereinafter, an operation of the program transformation apparatus for inserting the register circuits into the circuit description is described with reference to FIGS. 14 to 18. The circuit function of the modules 301A, 301B, 301C, 301D, and 301E is described in the circuit description by the designer.

Figure 14:
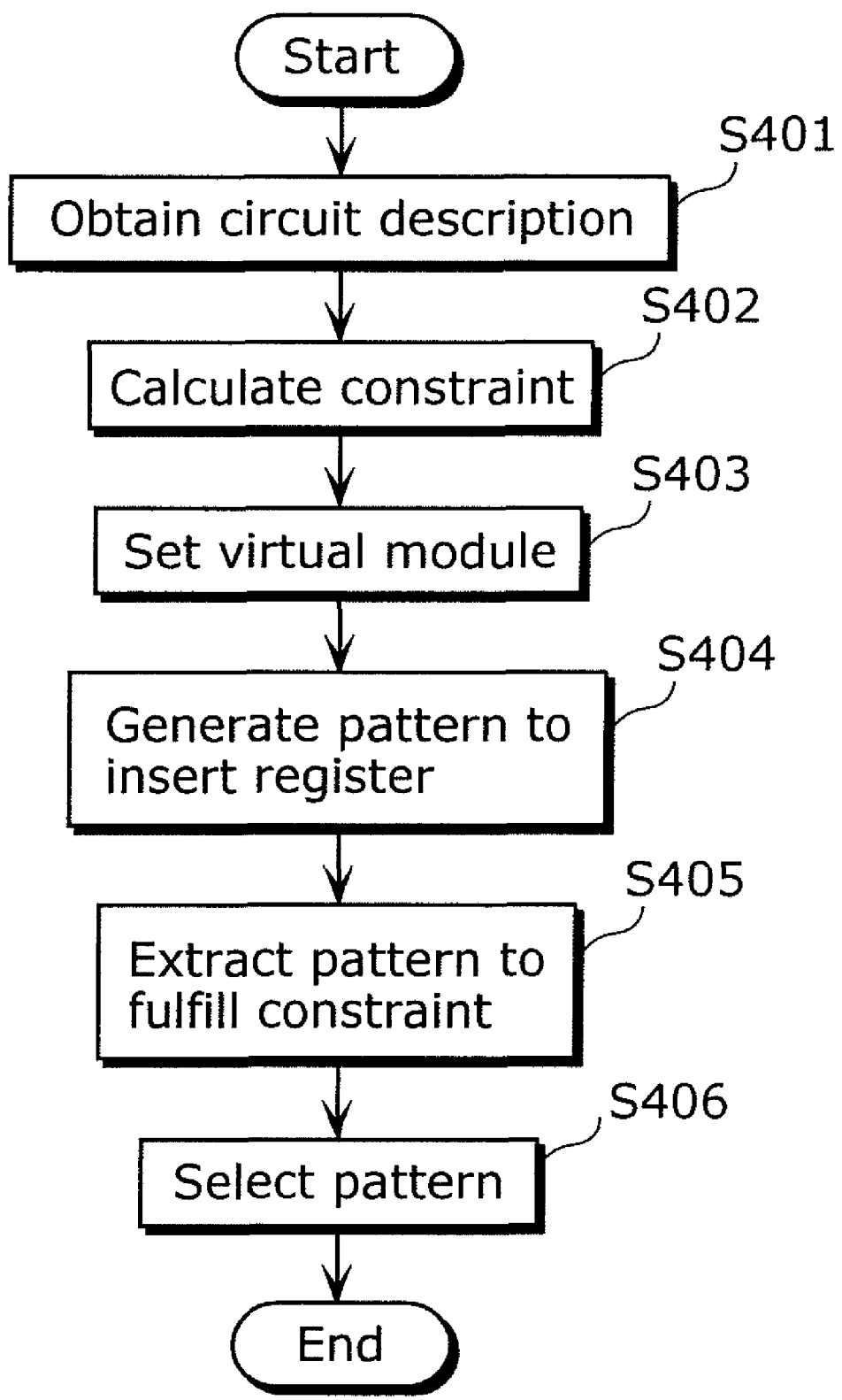
FIG. 14 is a flowchart that shows a process executed by a program transformation apparatus according to the third embodiment of the present invention.

FIG. 14 is a flowchart that shows a process executed by a program transformation apparatus according to the third embodiment of the present invention. FIGS. 15 to 18 illustrate the process executed by the program transformation apparatus.

First, the program transformation apparatus obtains the circuit description described by the designer. The circuit description is to be mapped on the reconfigurable logic semiconductor integrated circuit (S401). The circuit description obtained by the program transformation apparatus is a circuit description in which the designer has described a circuit function as a plurality of process modules. The circuit function is described in a hardware description language such as HDL or a high-level language such as C language. For example, the program transformation apparatus obtains the circuit description shown in FIG. 15.

Figure 15:
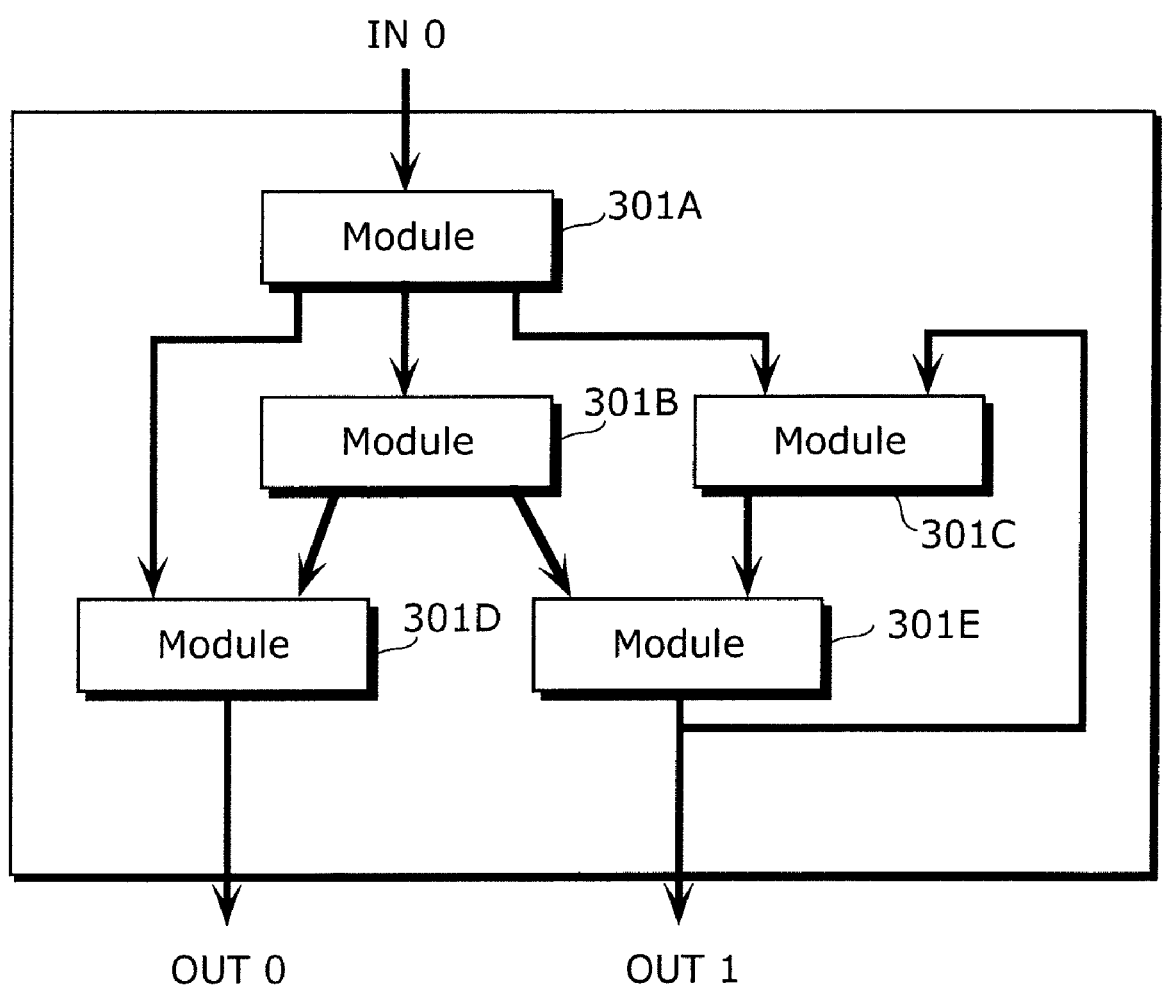
FIG. 15 illustrates a process executed by the program transformation apparatus according to the third embodiment of the present invention.

Next, the program transformation apparatus calculates relation (constraint) between input signals and output signals on the basis of the circuit description obtained in the step S401 (S402). The relation (constraint) is to be achieved when the circuit function composed of the plurality of the process modules is achieved in one circuit. Specifically, the program transformation apparatus calculates, on the basis of a cycle number necessary for processing the process modules included in the circuit description, a cycle number from input of a signal into the whole circuit until when an effective output signal is obtained. For example, the program transformation apparatus calculates a constraint that a cycle number from input of an input signal IN0 to obtainment of an output signal OUT0 shown in FIG. 15 is five or less. The program transformation apparatus also calculates a constraint that a cycle number from input of an input signal IN0 to obtainment of an output signal OUT1 is three or less.

Figure 16:
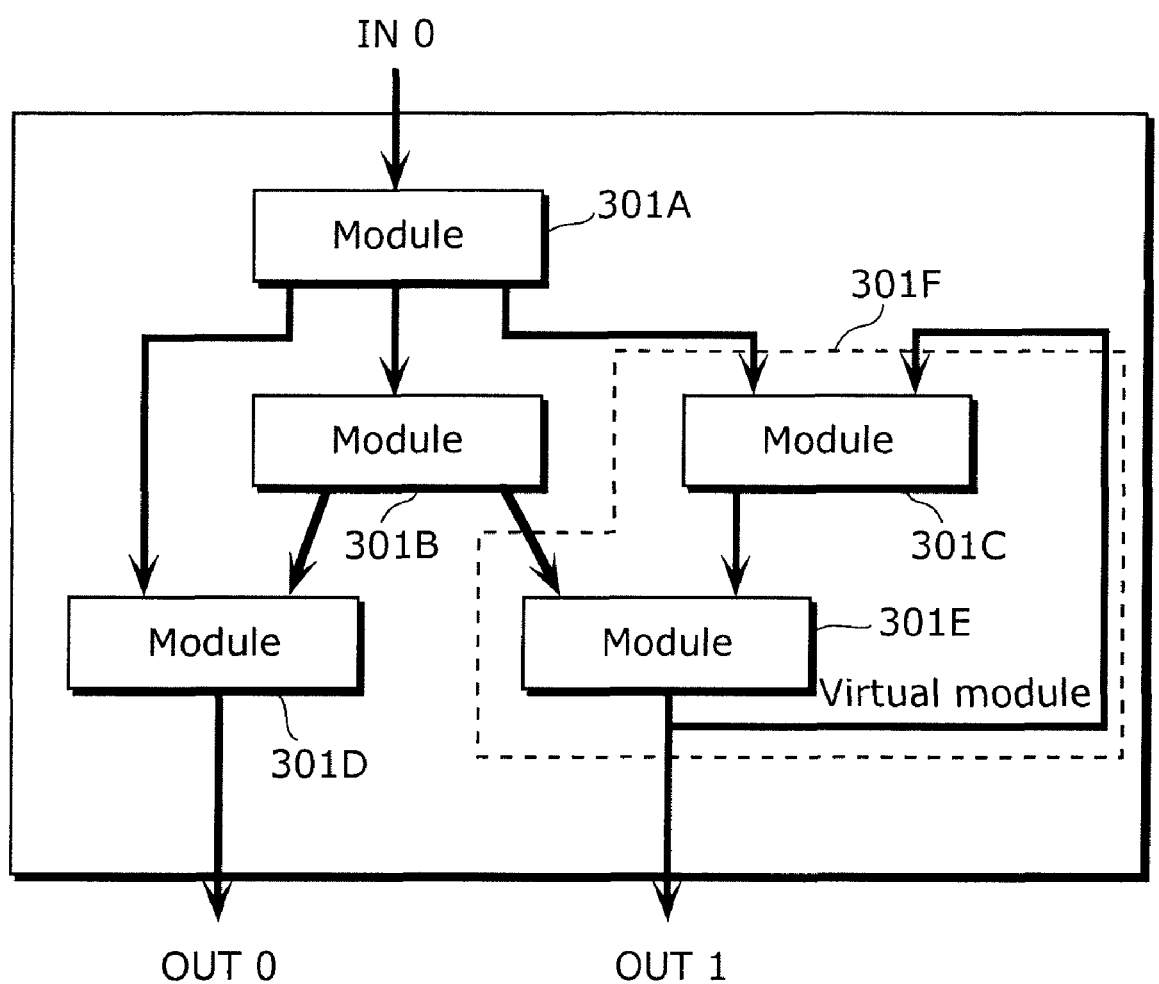
FIG. 16 illustrates a process executed by the program transformation apparatus according to the third embodiment of the present invention.

Subsequently, the program transformation apparatus sets a virtual module (S403). Specifically, the program transformation apparatus extracts a plurality of modules that forms a feedback system out of a plurality of modules, and sets the extracted modules as one virtual module. For example, a module 301E feeds back output to a module 301C as shown in FIG. 16. The program transformation apparatus thus sets the module 301C and the module 301E as a virtual module 301F. The program transformation apparatus also sets a module 301A, 301B, and 301D that do not form a feedback system each as one module. In other words, the program transformation apparatus handles the modules 301A, 301B, and 301D, and the virtual module 301F each as one module in the process afterward.

Figure 17:
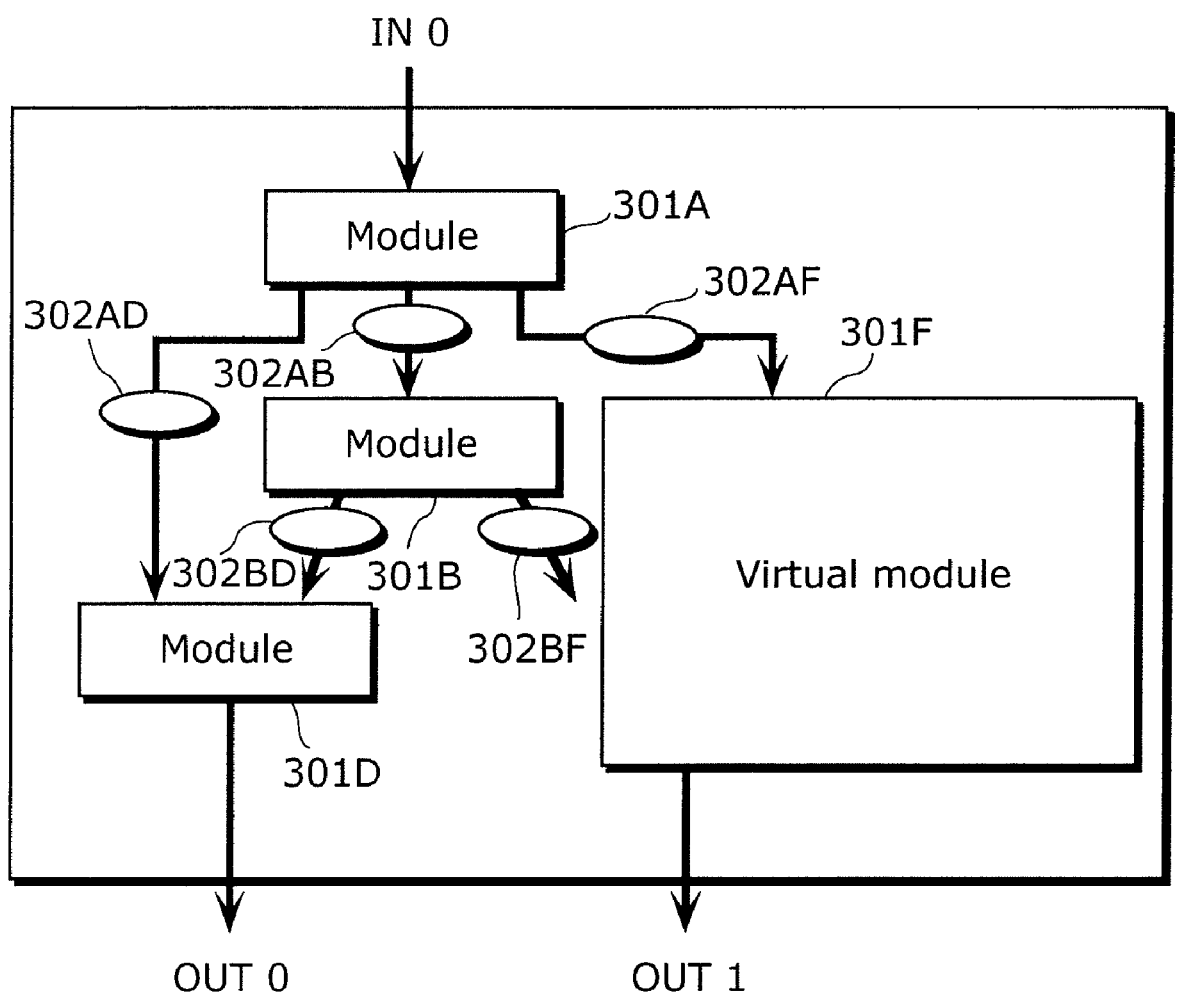
FIG. 17 illustrates a process executed by the program transformation apparatus according to the third embodiment of the present invention.
Figure 18:
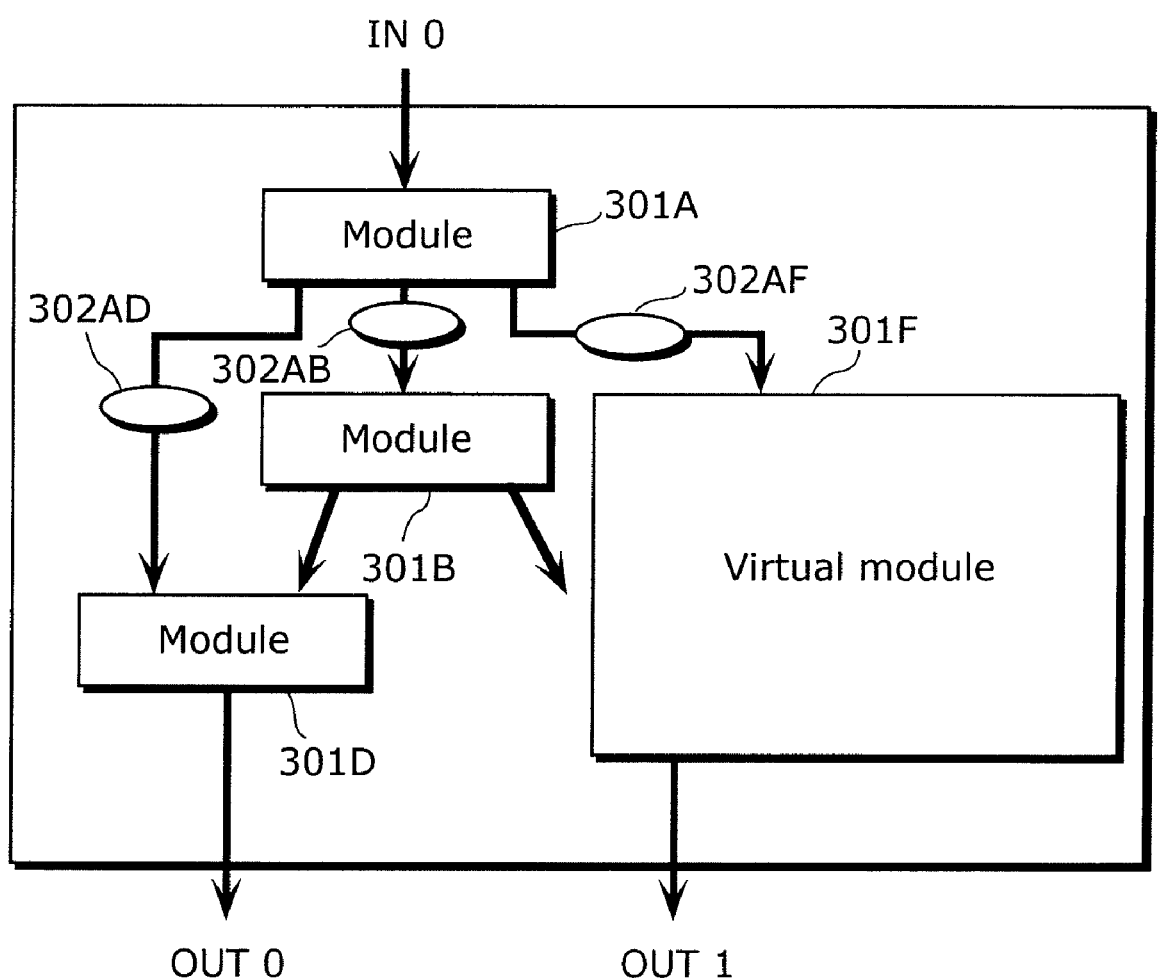
FIG. 18 illustrates a process executed by the program transformation apparatus according to the third embodiment of the present invention.

Following this, the program transformation apparatus generates a pattern where registers are inserted between the modules 301A, 301B, 301D, and the virtual module 301F, and a pattern where they are not inserted there (S404). FIG. 17 exemplarily shows one of a plurality of patterns generated by the program transformation apparatus. This pattern has more registers to be inserted than any other patterns: registers 302AB, 302AD, 302AF, 302BD, and 302BF between the modules 301A, 301B, 301D, and the virtual module 301F. The program transformation apparatus also generates a pattern where one or more of the registers 302AB, 302AD, 302AF and 302BD are inserted, and a pattern where none of them is inserted. Hereinafter, the registers 302AB, 302AD, 302AF and 302BD are referred to as registers 302 when they are mentioned with no specific distinction.

For example, assuming the number of relationships where two modules transmit and receive a signal as N, the program transformation apparatus generates $2^N$ patterns. For the example shown in FIG. 17, there are five relationships where two modules transmit and receive a signal. The program transformation apparatus thus generates $2^5$, that is, 32 patterns. Each of the registers 302 to be inserted is a pair of two registers in series, respectively.

The program transformation apparatus then extracts a pattern that fulfills the constraint calculated in the step S402 out of the plurality of patterns generated in the step S404. The program transformation apparatus judges whether or not each of the patterns generated in the step S404 fulfills the constraint calculated in the step S402. For example, the program transformation apparatus extracts a pattern shown in FIG. 18 when the constraint is not fulfilled with either of the registers 302BD or 302BF inserted. This pattern is extracted as the one that fulfills the constraint with registers 302AB, 302AD, and 302AF inserted. The program transformation apparatus also extracts, as patterns that fulfills the constraint, a pattern where one or more of the registers 302AB, 302AD, and 302AF are inserted, and a pattern where none of them is inserted.

The program transformation apparatus then selects one of the patterns extracted in the step S405 (S406). For example, the program transformation apparatus selects the pattern that has the most registers to be inserted among the extracted patterns. Specifically, the program transformation apparatus in the example shown in FIG. 18 selects the pattern where registers 302AB, 302AD, and 302AF are inserted. The steps from the step S202 shown in FIG. 9 are followed by the mapping apparatus 400 according to the selected pattern.

The program transformation apparatus selects a pattern other than the one selected in the step S406 from the patters extracted in the step S405 when the constraint is not fulfilled or mapping is judged to be impossible in the process afterward. The steps from the step S202 are followed by the mapping apparatus 400 according to the newly selected pattern.

This is how the program transformation apparatus according to the third embodiment of the present invention inserts registers corresponding to the register circuits 102 into a circuit description. In other words, the program transformation apparatus according to the third embodiment of the present invention is capable of converting a circuit description described in a conventional manner by a designer into a circuit description with two registers in series inserted between modules.

Furthermore, the program transformation apparatus according to the third embodiment of the present invention is capable of extracting only a pattern that fulfills the constraint from the plurality of patterns where registers are inserted.

Furthermore, the program transformation apparatus according to the third embodiment of the present invention does not insert a register between modules that form a feedback system. Inserting a register between the modules that form a feedback system will complicate the judgment on whether or not the constraint is fulfilled in the step S405 and lead to increase in workload of the program transformation apparatus. The program transformation apparatus according to the third embodiment of the present invention does not insert a register between modules that form a feedback system, so that it can reduce the workload.

Although the program transformation apparatus is described to obtain a circuit description in which a circuit function is described as a plurality of process modules in the step S401, the program transformation apparatus may obtain a large-scale circuit description and divide the obtained circuit description into a plurality of process modules.

Although the program transformation apparatus is described to calculate a constraint on the basis of a circuit description, the program transformation apparatus may also use a constraint inputted by a designer.

It is also possible that the program transformation apparatus is implemented as one of functions of the mapping apparatus 400 described in the first embodiment.

INDUSTRIAL APPLICABILITY

The present invention is applicable to various electronic apparatus because of its capability of mapping a large-scale circuit function on a reconfigurable logic semiconductor integrated circuit.

The invention claimed is:

1. A semiconductor integrated circuit, comprising:
a plurality of reconfigurable cores arranged separately from one another, said plurality of reconfigurable cores each operating synchronously with respect to a clock signal and having a logic reconfiguration function; and
a first group of registers formed between a first reconfigurable core and a second reconfigurable core included in said plurality of reconfigurable cores, said first group of registers being configured to temporarily hold an output from said first reconfigurable core and transfer the output from said first reconfigurable core to said second reconfigurable core,
wherein said plurality of reconfigurable cores each includes:
a plurality of logic elements arranged in a matrix and each configured to implement a predetermined logic; and
programmable wiring interconnecting said plurality of logic elements,
wherein said first group of registers include a first register and a second register that each receive a same clock signal as a clock signal provided for said second reconfigurable core, said second reconfigurable core receiving data held in said second register.

2. The semiconductor integrated circuit according to claim 1,
wherein said
first register is configured to temporarily hold the output from said first reconfigurable core, and
said second register is configured to hold the data, the data being outputted from said first register, and output the data to said second reconfigurable core.

3. The semiconductor integrated circuit according to claim 1,
wherein said first reconfigurable core and said second reconfigurable core each receive different clock signals.

4. The semiconductor integrated circuit according to claim 1,
wherein said plurality of reconfigurable cores includes a third reconfigurable core and a fourth reconfigurable core each having a rectangular shape defined by a first side, a second side opposite to the first side, a third side perpendicular to the first side, and a fourth side opposite to the third side, the first side being configured to receive configuration data for reconfiguring logic of at least one of said third reconfigurable core and said fourth reconfigurable core, and
said third and fourth reconfigurable cores being arranged separately from each other with the first side of said third reconfigurable core and the first side of said fourth reconfigurable core facing each other.

5. The semiconductor integrated circuit according to claim 4, further comprising:
a first storage formed between said third and fourth reconfigurable cores, said first storage configured to store the configuration data for reconfiguring logic of at least one of said third and fourth reconfigurable cores.

6. The semiconductor integrated circuit according to claim 5,
wherein said plurality of reconfigurable cores further includes a fifth reconfigurable core and a sixth reconfigurable core each having a rectangular shape defined by a first side, a second side opposite to the first side, a third side perpendicular to the first side, and a fourth side opposite to the third side,
said fifth and sixth reconfigurable cores being arranged separately from each other with the first side of said fifth reconfigurable core and the first side of said sixth reconfigurable core facing each other,
said third and fifth reconfigurable cores being arranged separately from each other with the third side of said third reconfigurable core and the third side of said fifth reconfigurable core cores facing each other, and
said fourth and sixth reconfigurable cores being arranged separately from each other with the third side of said fourth reconfigurable core and the third side of said sixth reconfigurable core facing each other.

7. The semiconductor integrated circuit according to claim 6, further comprising:
a second storage formed between said fifth and sixth reconfigurable cores, said second storage being configured to store configuration data for reconfiguring logic of said fifth and sixth reconfigurable cores.

8. The semiconductor integrated circuit according to claim 1, further comprising:
a clock signal stopper that stops providing a clock signal to said first group of registers.

9. The semiconductor integrated circuit according to claim 1,
wherein said first group of registers includes:
a second group of registers configured to temporarily hold the output from said first reconfigurable core and transfer the output to said second reconfigurable core; and
a third group of registers configured to temporarily hold the output from said second reconfigurable core and transfer the output from said second reconfigurable core to said first reconfigurable core.

10. The semiconductor integrated circuit according to claim 1,
wherein said first group of registers is located at a gap between each of said plurality of reconfigurable cores, each of said plurality of reconfigurable cores being arranged side by side, and is configured to temporarily hold an output from one member of a pair of reconfigurable cores and to transfer the output from one member of the pair of reconfigurable cores to another member of the pair of reconfigurable cores.

11. The semiconductor integrated circuit according to claim 1,
wherein each of said plurality of reconfigurable cores receive a same clock signal.

12. The semiconductor integrated circuit according to claim 1,
wherein said first group of registers holds a plurality of sets of multi-bit data.

13. The semiconductor integrated circuit according to claim 1,
wherein each of said logic elements has a lookup table (LUT).

14. The semiconductor integrated circuit according to claim 1,
wherein each of said logic elements has at least one arithmetic logic unit (ALU).

15. The semiconductor integrated circuit according to claim 1, further comprising a CPU,
wherein said plurality of reconfigurable cores, said first group of registers, and said CPU are installed on a single semiconductor substrate.

16. A semiconductor integrated circuit, comprising:
a plurality of reconfigurable cores arranged separately from one another, said plurality of reconfigurable cores each operating synchronously with respect to a clock signal and having a logic reconfiguration function; and
a bi-directional register formed between a first reconfigurable core and a second reconfigurable core included in said plurality of reconfigurable cores, said bi-directional register being configured to temporarily hold an output from said first reconfigurable core and transfer the output from said first reconfigurable core to said second reconfigurable core, and to temporarily hold an output from said second reconfigurable core and transfer the output from said second reconfigurable core to said first reconfigurable,
wherein said plurality of reconfigurable cores each includes:
a plurality of logic elements arranged in a matrix and each configured to implement a predetermined logic; and
programmable wiring interconnecting said plurality of logic elements,
wherein said bi-directional register receives a same clock signal as a clock signal provided to said second reconfigurable core.

17. A semiconductor integrated circuit, comprising:
a plurality of reconfigurable cores arranged separately from one another, said plurality of reconfigurable cores each operating synchronously with respect to a clock signal and having a logic reconfiguration function; and
a first group of registers formed between a first reconfigurable core and a second reconfigurable core included in said plurality of reconfigurable cores, said first group of registers being configured to temporarily hold an output from said first reconfigurable core and transfer the output from said first reconfigurable core to said second reconfigurable core,
wherein said plurality of reconfigurable cores each includes:
a plurality of logic elements arranged in a matrix and each configured to implement a predetermined logic; and
programmable wiring interconnecting said plurality of logic elements,
wherein said first group of registers receives a same clock signal as a clock signal provided for said second reconfigurable core.

* * * * *